(12) United States Patent
Matsueda et al.

(10) Patent No.: US 12,125,422 B2
(45) Date of Patent: *Oct. 22, 2024

(54) DISPLAY DEVICE AND METHOD OF CONTROLLING THE SAME

(71) Applicant: Wuhan Tianma Micro-Electronics Co., Ltd., Wuhan (CN)

(72) Inventors: Yojiro Matsueda, Kanagawa (JP); Masamichi Shimoda, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/303,147

(22) Filed: Apr. 19, 2023

(65) Prior Publication Data

US 2023/0343258 A1 Oct. 26, 2023

(30) Foreign Application Priority Data

Apr. 20, 2022 (JP) ................................. 2022-069230

(51) Int. Cl.
*G09G 3/00* (2006.01)
*G06F 3/044* (2006.01)
*G09G 3/3233* (2016.01)
*H10K 59/12* (2023.01)

(52) U.S. Cl.
CPC ............ *G09G 3/006* (2013.01); *G06F 3/0446* (2019.05); *G09G 3/3233* (2013.01); *G06F 2203/04111* (2013.01); *G09G 2300/0413* (2013.01); *G09G 2300/0452* (2013.01); *G09G 2300/0842* (2013.01); *G09G 2300/0861* (2013.01);

(Continued)

(58) Field of Classification Search
CPC ......... G06F 2203/04111; G06F 3/0446; G09G 2300/0413; G09G 2300/0452; G09G 2300/0842; G09G 2300/0861; G09G 2320/029; G09G 2320/045; G09G 2330/12; G09G 3/006; G09G 3/20; G09G 3/3233; H10K 59/12; H10K 59/40; H10K 59/88

See application file for complete search history.

(56) References Cited

U.S. PATENT DOCUMENTS 5,850,205 A * 12/1998 Blouin ................. G09G 3/3406
345/89
9,852,686 B2 * 12/2017 So ........................ G09G 3/3233

(Continued)

*Primary Examiner* — Dmitriy Bolotin
(74) *Attorney, Agent, or Firm* — Sughrue Mion, PLLC

(57) ABSTRACT

A display device includes a deterioration evaluation region including dummy pixels and a display region. A control circuit determines a gray level for a first display pixel and determines whether the first display pixel is in a first deterioration mode or a second deterioration mode based on a driving history of the first display pixel. The control circuit determines, in the first deterioration mode, a data signal to be supplied to the first display pixel based on the gray level and the driving history of the first display pixel. The control circuit determines, in the second deterioration mode, a data signal to be supplied to the first display pixel based on the gray level, the driving history of the first display pixel, and measurement results about a current-voltage characteristic acquired from dummy pixels in the deterioration evaluation region of the same color as the first display pixel.

6 Claims, 22 Drawing Sheets

(52) U.S. Cl.
CPC . *G09G 2320/029* (2013.01); *G09G 2320/045* (2013.01); *G09G 2330/12* (2013.01); *H10K 59/12* (2023.02)

(56) References Cited

U.S. PATENT DOCUMENTS

| | | | | |
|---|---|---|---|---|
| 2010/0073346 | A1* | 3/2010 | Min | G09G 3/3291 345/211 |
| 2011/0069061 | A1* | 3/2011 | Nakamura | G09G 3/3291 345/214 |
| 2016/0027378 | A1* | 1/2016 | Kim | G02B 6/0055 345/207 |
| 2016/0086548 | A1* | 3/2016 | Maeyama | G09G 3/3233 345/82 |
| 2016/0189644 | A1* | 6/2016 | So | G09G 3/3233 345/103 |
| 2017/0270855 | A1 | 9/2017 | Maeda | |
| 2017/0322357 | A1* | 11/2017 | de Jong | G02B 5/223 |
| 2018/0143711 | A1* | 5/2018 | Ono | G02F 1/13338 |
| 2018/0151119 | A1 | 5/2018 | Lee et al. | |
| 2018/0330672 | A1* | 11/2018 | Park | G09G 3/3233 |
| 2022/0028311 | A1* | 1/2022 | Matsueda | G09G 3/006 |
| 2022/0028335 | A1* | 1/2022 | Matsueda | G06F 3/0412 |
| 2023/0225178 | A1* | 7/2023 | Kim | G09G 3/3233 |
| 2023/0343258 | A1* | 10/2023 | Matsueda | G09G 3/006 |
| 2023/0343298 | A1* | 10/2023 | Matsueda | G09G 3/3275 |

\* cited by examiner

PIXEL CIRCUIT IN NORMAL DISPLAY REGION

PIXEL CIRCUIT IN DETERIORATION EVALUATION REGION

EXAMPLES OF VARIATION IN LUMINANCE – VARIATION IN VOLTAGE OF RED SUBPIXEL

EXAMPLES OF VARIATION IN LUMINANCE – VARIATION IN VOLTAGE OF GREEN SUBPIXEL

DISPLAY DEVICE AND METHOD OF CONTROLLING THE SAME

CROSS-REFERENCE TO RELATED APPLICATIONS

This non-provisional application claims priority under 35 U.S.C. § 119(a) on Patent Application No. 2022-069230 filed in Japan on Apr. 20, 2022, the entire content of which is hereby incorporated by reference.

BACKGROUND

This disclosure relates to a display device and a method of controlling the display device.

An organic light-emitting diode (OLED) element is a current-driven light-emitting element and therefore, does not need a backlight. In addition to this, the OLED element has advantages for achievement of low power consumption, wide viewing angle, and high contrast ratio; it is expected to contribute to development of flat panel display devices.

An OLED element deteriorates with its lighting time (driving time). A deteriorated OLED element does not light at the same brightness with the same driving current as before. Furthermore, the same driving current as before cannot be attained unless higher driving voltage is applied. An OLED element requires increase in driving voltage and degrades the brightness of its light with driving time.

There are some external compensation techniques to compensate for the degradation in brightness of an OLED element. An external compensation technique utilizes the results of evaluating the deterioration of OLED elements being monitored and accumulated data about light emission of individual OLED elements.

SUMMARY

An aspect of this disclosure is a display device including: a display region on a substrate, the display region including a plurality of display pixels and being configured to display images in accordance with video data from an external; a deterioration evaluation region disposed outside the display region on the substrate, the deterioration evaluation region including a plurality of dummy pixels; a light blocking part disposed on a side to be viewed of the deterioration evaluation region; and a control circuit configured to control the display region and the deterioration evaluation region. Each of the plurality of display pixels and the plurality of dummy pixels includes a light-emitting element and a pixel circuit. The control circuit is configured to: determine a gray level for a first display pixel based on video data; determine whether the first display pixel is in a first deterioration mode or a second deterioration mode following the first deterioration mode based on a driving history of the first display pixel; determine, in a case of determining that the first display pixel is in the first deterioration mode, a data signal to be supplied to the first display pixel based on the gray level and the driving history of the first display pixel, using first adjustment information for the first deterioration mode; and determine, in a case of determining that the first display pixel is in the second deterioration mode, a data signal to be supplied to the first display pixel based on the gray level, the driving history of the first display pixel, and measurement results about a current-voltage characteristic acquired from dummy pixels in the deterioration evaluation region of the same color as the first display pixel, using second adjustment information for the second deterioration mode that is different from the first adjustment information.

It is to be understood that both the foregoing general description and the following detailed description are exemplary and explanatory and are not restrictive of this disclosure.

EMBODIMENTS

Figure 1:
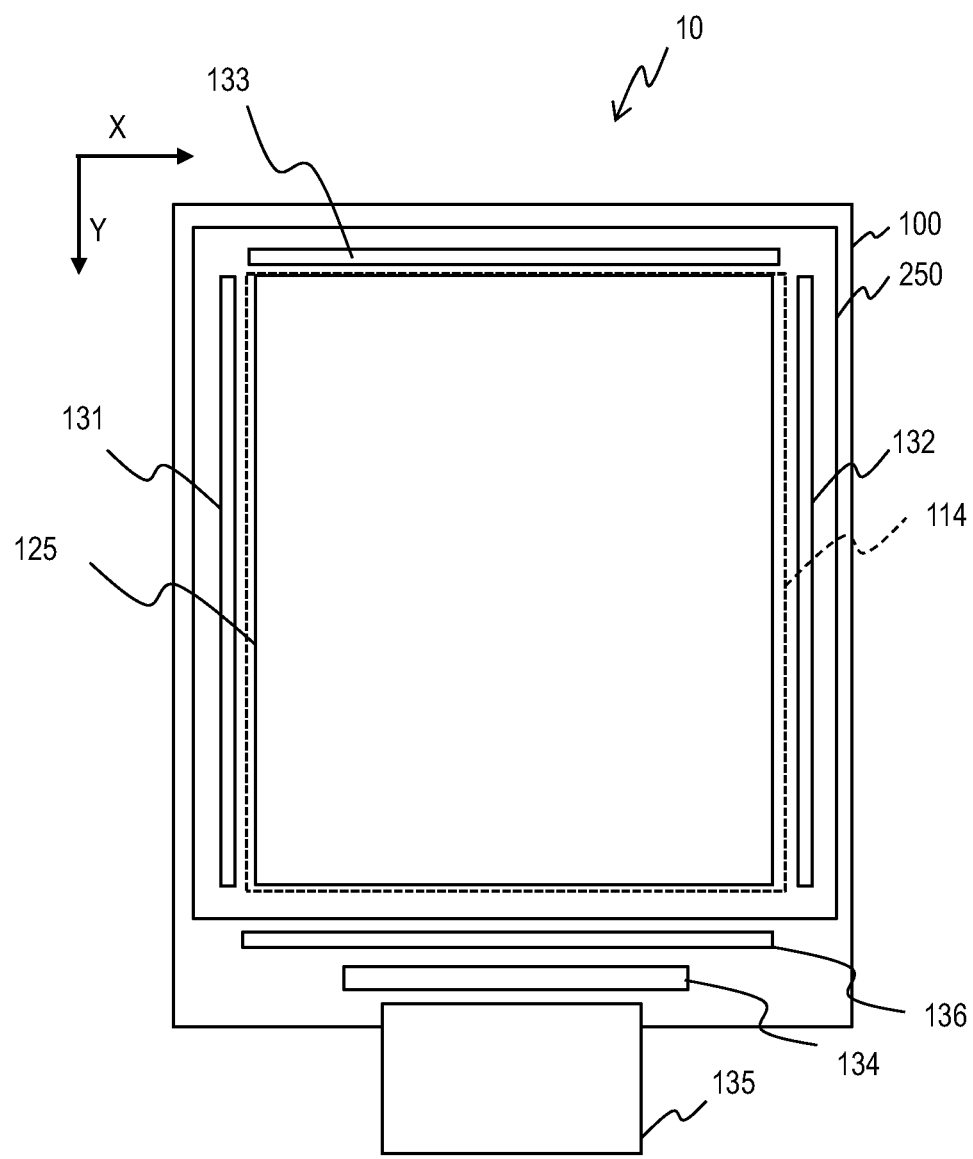
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure.

In the following description, a pixel is the smallest unit in the display region and an element for emitting light of a single color. It is also referred to as a subpixel. A set of pixels of different colors (red, blue, and green, for example) constitute an element for displaying one mixed-color dot. This element can be referred to as main pixel.

In the following description, a pixel can include a light-emitting element and a pixel circuit for controlling the light-emitting element. When an element for emitting light of a single color needs to be distinguished from an element for emitting light of a mixed color for clarity of description, the former is referred to as subpixel and the latter as main pixel. The features of this specification are applicable to monochrome display devices whose display regions are composed of monochrome pixels.

The variation in characteristics of an OLED element is non-uniform; it is not easy to accurately monitor and compensate for the variation. Specifically, deterioration (variation in characteristics) of an OLED element is generally separated into two modes: an initial deterioration mode that appears in the initial period from start of driving and a steady deterioration mode that appears in the period subsequent to the initial period. The initial deterioration mode exhibits more complex variation than the steady deterioration mode.

The initial deterioration mode is more likely to depend on the production variation; the variation in characteristics in the initial deterioration mode is different among display panels. It is difficult to determine the variation in characteristics in the initial deterioration mode and the transition point from the initial deterioration mode to the steady deterioration mode identically to different display panels.

Accordingly, identifying whether an OLED element is in the initial deterioration mode in the initial period or the steady deterioration mode in the period following the initial period is important to increase the accuracy in compensation. The same applies to display devices employing light-emitting elements different from OLED elements.

A display device in an embodiment of this specification determines whether the deterioration of a pixel is in the initial deterioration mode or the steady deterioration mode based on the driving history of the pixel. The display device determines a data signal to be supplied to the pixel based on the gray level (emission level) determined from video data, using a method appropriate for the initial deterioration mode or the steady deterioration mode selected in accordance with the result of determination. Hence, emission control appropriate for the deterioration mode is performed on each pixel.

Configuration of Display Device

A configuration example of a display device is described. The light-emitting element of a pixel in the example described in the following is a current-driven element, such as organic light-emitting diode (OLED) element. With reference to FIG. 1, the overall configuration of the display device in an embodiment is described. The elements in the drawings may be exaggerated in size or shape for clear understanding of the description. The following describes an organic light-emitting diode (OLED) display device as an example of the display device.

FIG. 1 schematically illustrates a configuration example of an OLED display device 10. The OLED display device 10 includes a thin-film transistor (TFT) substrate 100 including OLED elements (light-emitting elements) and a structural encapsulation unit 250 for encapsulating the OLED elements. The TFT substrate 100 includes an insulating substrate on which the OLED elements are fabricated. The insulating substrate can be a flexible polyimide substrate or a rigid glass substrate.

A pixel array region 125 of the TFT substrate 100 includes a plurality of OLED elements and a plurality of pixel circuits for controlling light emission of the OLED elements. A cathode electrode region 114 is spread to a region outer than the pixel array region 125; control circuits are disposed around the periphery of the cathode electrode region 114. The control circuits include a scanning driver 131, an emission driver 132, an aging test circuit 133, a driver IC 134, and a demultiplexer 136. The driver IC 134 is connected to external devices through flexible printed circuits (FPC) 135.

The scanning driver 131 drives scanning lines on the TFT substrate 100 and further, drives selection lines for a pre-shipment aging test and a post-shipment deterioration evaluation on dummy pixels, which will be described later. The emission driver 132 drives emission control lines to control light emission of pixels. The aging test circuit 133 supplies data signals for the pre-shipment aging test to the pixel array region 125. The aging test circuit 133 can include a not-shown electrostatic discharge protection circuit.

The driver IC 134 is mounted with an anisotropic conductive film (ACF), for example. The driver IC 134 is connected to external devices through flexible printed circuits 135.

The driver IC 134 drives and controls the other circuits 131 to 133 on the substrate. The driver IC 134 provides power and control signals including a timing signal to the scanning driver 131 and the emission driver 132.

The driver IC 134 also generates data signals from video data received from the external and supplies the data signals to the pixel array region 125 together with power supply potentials. The data signals are provided to the pixel array region 125 through the demultiplexer 136.

The driver IC 134 provides power and data signals to the demultiplexer 136. The demultiplexer 136 outputs output of one pin of the driver IC 134 to d data lines (d is an integer greater than 1) in turn. The demultiplexer 136 changes the output data line for the data signal from the driver IC 134 d times per scanning period to drive d times as many data lines as output pins of the driver IC 134.

Wiring Layout

Figure 2A:
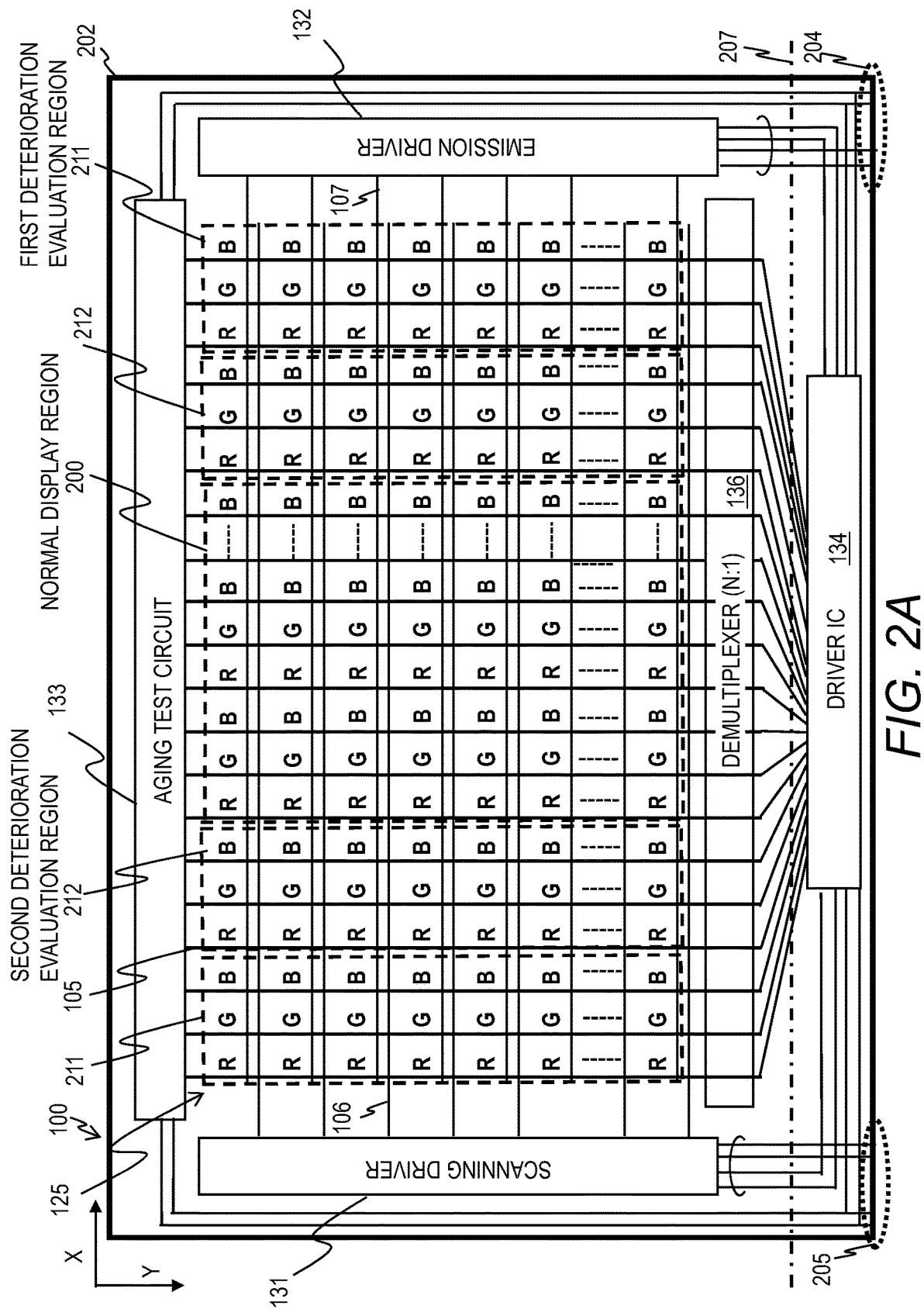
FIG. 2A schematically illustrates a layout of control lines on a TFT substrate.

Hereinafter, an example of the wiring layout of the OLED display device 10 is described. FIG. 2A schematically illustrates a layout of control lines on the TFT substrate 100. FIG.

2B schematically illustrates a layout of an anode power line pattern and a cathode electrode on the insulating substrate 202.

In the configuration example of FIG. 2A, the pixel array region 125 includes a normal display region 200 at the middle, two second deterioration evaluation regions 212 sandwiching the normal display region 200, and two first deterioration evaluation regions (test regions) 211 sandwiching these regions 200 and 212. A first deterioration evaluation region 211, a second deterioration evaluation region 212, the normal display region 200, another second deterioration evaluation region 212, and another first deterioration evaluation region 211 are disposed in this order from the left to the right of FIG. 2A. The pixels in the normal display region 200 can be referred to display pixels and the pixels in the first deterioration evaluation regions 211 as test pixels.

The normal display region 200 is to display images in accordance with video data received from the external. The first deterioration evaluation regions 211 are used for an aging test that is conducted before shipment of the OLED display device 10 and not used to display images in accordance with video data from the external. As will be described later, the first deterioration evaluation regions 211 are accelerated to deteriorate by accelerated aging. The aging test evaluates the progress of deterioration of OLED elements caused by the accelerated aging and generates adjustment data based on the evaluation results. The adjustment data is consulted to adjust data signals to be supplied to the pixel circuits in the normal display region 200.

The second deterioration evaluation regions 212 are used to evaluate the deterioration of the pixels after shipment of the OLED display device 10 and not used to display images. The second deterioration evaluation regions 212 are controlled under the same conditions as the normal display region 200. Specifically, the second deterioration evaluation regions 212 are supplied with the same power supply voltage as the one supplied to the normal display region 200 and the upper and the lower limits of the data signal for the second deterioration evaluation regions 212 are the same as those for the normal display region 200.

The pixel layout in the normal display region 200 in the example of FIG. 2A is stripe arrangement. Specifically, each subpixel column extending along the Y-axis (vertical axis) is composed of subpixels of the same color. A subpixel includes an OLED element and a pixel circuit therefor. Each subpixel row extending along the X-axis (horizontal axis) is composed of red subpixels, green subpixels, and blue subpixels disposed cyclically.

Two second deterioration evaluation regions 212 are provided adjacent to the normal display region 200 on both sides. The pixel layout there is stripe arrangement, like in the normal display region 200. Each second deterioration evaluation region 212 in FIG. 2A includes one red dummy subpixel column, one green dummy subpixel column, and one blue dummy subpixel column but each second deterioration evaluation region 212 can include a plurality of dummy subpixel columns of each color for more accurate deterioration compensation.

Two first deterioration evaluation regions 211 are provided each adjacent to the outer end of a second deterioration evaluation region 212. The pixel layout there is stripe arrangement, like in the normal display region 200. Each first deterioration evaluation region 211 in FIG. 2A includes one red dummy subpixel column, one green dummy subpixel column, and one blue dummy subpixel column but each first deterioration evaluation region 211 can include a plurality of dummy subpixel columns of each color for more accurate deterioration compensation.

The number of pixel rows (subpixel rows) in the first deterioration evaluation regions 211 and the second deterioration evaluation regions 212 is equal to the number of pixel rows (subpixel rows) in the normal display region 200. In another example, the number of pixel rows in the first deterioration evaluation regions 211 and the second deterioration evaluation regions 212 can be smaller than the number of pixel rows in the normal display region 200. In that case, the number of connected pixels per control line is different among the scanning lines 106 and the emission control lines 107. This means that the loads to the control lines are different. Accordingly, arrangement is necessary for the capability of the output buffer for outputting control signals and the voltage levels of the control signals so that the accuracy in deterioration evaluation will not be affected by the difference in load among the control lines that could cause delay in control signals.

The pixel layout in the deterioration evaluation regions 211 and 212 can be different from the pixel layout in the normal display region 200. The deterioration evaluation regions 211 and 212 and the normal display region 200 can employ any pixel layout.

A plurality of scanning lines 106 extend along the X-axis from the scanning driver 131. A plurality of emission control lines 107 extend along the X-axis from the emission driver 132. In FIG. 2A, one of the scanning lines and one of the emission control lines are provided with reference signs 106 and 107, respectively, by way of example. In the configuration example of FIG. 2A, a scanning line 106 transmits a selection signal for not only the normal display region 200 but also the deterioration evaluation regions 211 and 212. An emission control line 107 transmits an emission control signal for not only the normal display region 200 but also the deterioration evaluation regions 211 and 212.

A plurality of data lines 105 are disposed to extend along the Y-axis and be side by side along the X-axis within the pixel array region 125. In FIG. 2A, one of the data lines is provided with a reference sign 105 by way of example. The data lines 105 are connected to the aging test circuit 133 and also the demultiplexer 136. The data lines 105 are disposed in the normal display region 200 and the deterioration evaluation regions 211 and 212; each of them transmits data signals to the pixel circuits connected thereto.

Data signals for all pixel circuits in a pre-shipment aging test are supplied from the aging test circuit 133. After shipment, data signals for the normal display region 200 and the second deterioration evaluation regions 212 are supplied from the driver IC 134 and data signals for the first deterioration evaluation regions 211 are supplied from the driver IC 134 or the aging test circuit 133.

Although not shown in FIG. 2A, lines to be used to evaluate the deterioration of the dummy pixels in the deterioration evaluation regions 211 and 212 are provided on the insulating substrate 202. Specifically, selection lines for selecting a dummy pixel whose deterioration is to be evaluated and the sense lines for measuring the voltage of the OLED element in the selected dummy pixel are provided.

The selection lines can be controlled by the scanning driver 131 or a driver circuit different from the scanning driver 131 and the emission driver 132. The sense lines for the first deterioration evaluation regions 211 can be connected to the aging test circuit 133 and the signals from the first deterioration evaluation regions 211 are supplied to an external apparatus through the aging test circuit 133. The sense lines for the second deterioration evaluation regions 212 can be connected to the driver IC 134 or the aging test circuit 133 and the signals from the second deterioration evaluation regions 212 are supplied to the driver IC 134 directly or through the aging test circuit 133.

The driver IC 134 has not been mounted yet on the TFT substrate 100 during a pre-shipment aging test. For this reason, an external apparatus different from the TFT substrate 100 controls the scanning driver 131, the emission driver 132, and the aging test circuit 133 to perform the aging test on the first deterioration evaluation regions 211. The ellipses 204 and 206 in dashed lines represent the cut-off regions of the control lines connected to the external apparatus. The control lines extend to the end of the insulating substrate 202. As will be described later, a plurality of TFT substrates 100 are cut out from one motherboard. The aging test is performed on the TFT substrates 100 before being cut out from the motherboard.

Video data includes successive frames and the OLED display device 10 displays images corresponding to the individual frames. The driver IC 134 sends control signals to the scanning driver 131, the emission driver 132, and the aging test circuit 133. The driver IC 134 controls the timing of the scanning signal (selection pulses) from the scanning driver 131 and the emission control signal from the emission driver 132, based on video data from the external.

The driver IC 134 supplies data signals for the subpixels in the normal display region 200 to the demultiplexer 136. The driver IC 134 determines data signals for individual subpixels in the normal display region 200. A data signal for one subpixel is determined from intensity levels of one or more subpixels of video data (for one frame) received from the external. The demultiplexer 136 outputs one output of the driver IC 134 to N data lines 105 (N is an integer greater than 1) successively within a scanning period.

The driver IC 134 further supplies data signals for the dummy subpixels in the second deterioration evaluation regions 212. The driver IC 134 supplies data signals for the dummy subpixels to the second deterioration evaluation regions 212 through the data lines 105 associated with the dummy subpixels. The dummy subpixels to be supplied with data signals transmitted by one data line 105 are each selected by a different scanning line 106. Moreover, the driver IC 134 sends control signals for deterioration evaluation to the second deterioration evaluation regions 212 and receives measurement signals therefrom. For example, the driver IC 134 selects a dummy pixel circuit to be evaluated with a selection signal from the scanning driver 131 and measures the voltage of the OLED element in the selected dummy pixel with a sense line.

The driver IC 134 may supply data signals for dummy subpixels in the first deterioration evaluation regions 211 after shipment. The driver IC 134 supplies data signals for the dummy subpixels to the first deterioration evaluation regions 211 through the associated data lines 105. The dummy subpixels to be supplied with data signals transmitted by one data line 105 are each selected by a different scanning line 106. The driver IC 134 sends control signals for deterioration evaluation to the first deterioration evaluation regions 211 and receives measurement signals therefrom. For example, the driver IC 134 selects a dummy pixel circuit to be evaluated with a selection signal from the scanning driver 131 and measures the voltage of the OLED element in the selected dummy pixel with a sense line. The details of the deterioration evaluation will be described later.

The dashed-dotted line 207 represents a folding line of the TFT substrate 100. The insulating substrate 202 is a flexible substrate made of polyimide, for example. The region including the driver IC 134 is folded back. As a result, the TFT substrate 100 can reduce its overall size. The insulating substrate 200 can be a rigid substrate.

Figure 2B:
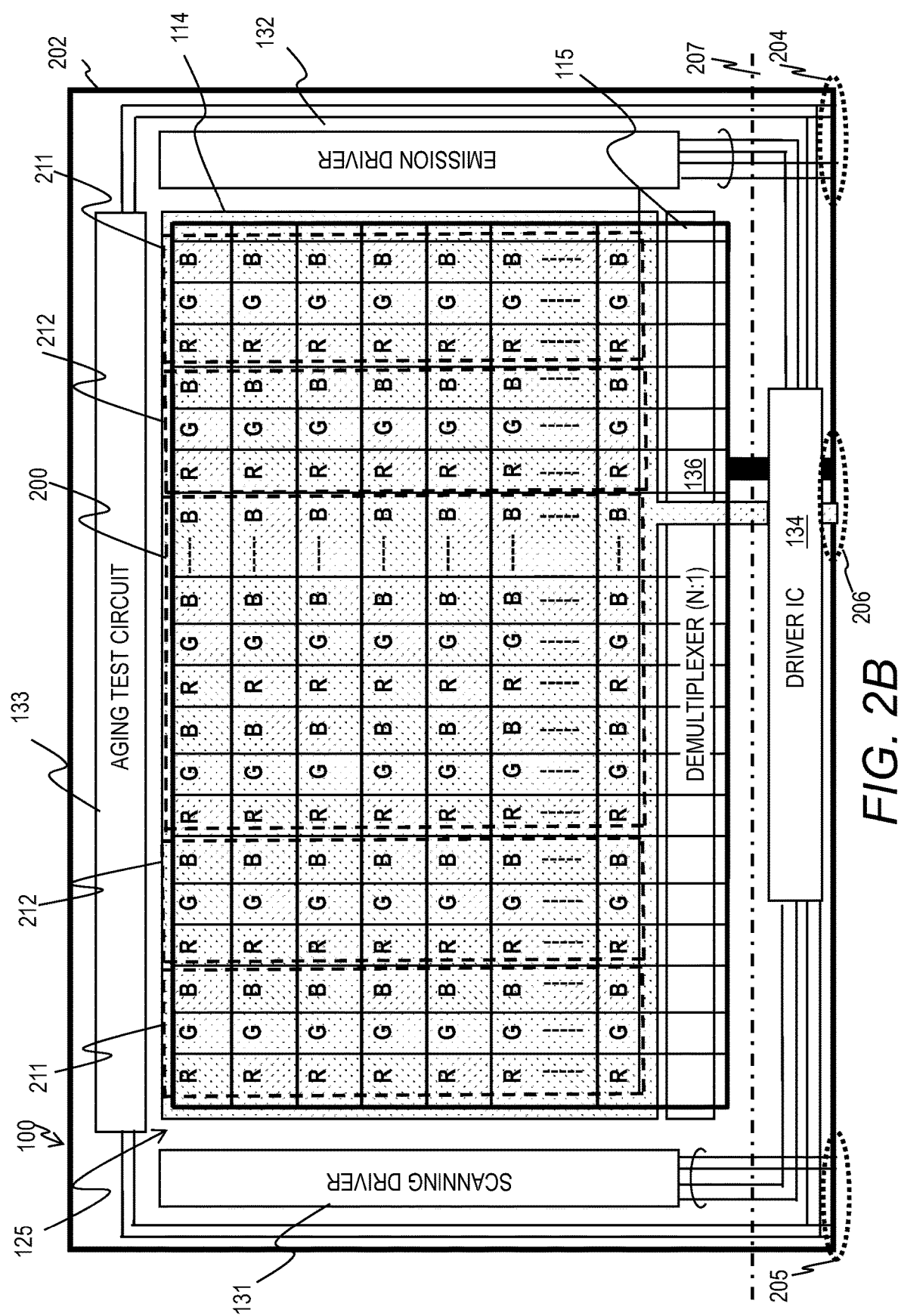
FIG. 2B schematically illustrates a layout of an anode power line pattern and a cathode electrode on an insulating substrate.

FIG. 2B schematically illustrates a layout of an anode power line pattern and a cathode electrode on the TFT substrate 100. As illustrated in FIG. 2B, the TFT substrate 100 includes an anode power line pattern 115. The anode power line pattern 115 supplies the pixel circuits in the normal display region 200, the first deterioration evaluation regions 211, and the second deterioration evaluation regions 212 with an anode power supply potential.

The driver IC 134 outputs an anode power supply potential to the anode power line pattern 115 and a cathode power supply potential to the cathode electrode 114. The anode power line pattern 115 has a mesh-like shape; it includes an outline part defining the outer end of the pattern, a plurality of X-axis parts, and a plurality of Y-axis parts. The X-axis parts are disposed to extend along the X-axis and be one above another along the Y-axis in the region inner than the outline part. The Y-axis parts are disposed to extend along the Y-axis and be side by side along the X-axis in the region inner than the outline part. The X-axis parts and the Y-axis parts extend from one side to the opposite side of the outline part. The anode power line pattern 115 can have a different shape.

The cathode electrode 114 has a sheet-like shape that fully covers the normal display region 200, the first deterioration evaluation regions 211, and the second deterioration evaluation regions 212. The cathode electrode of each subpixel in these regions is a part of the sheet-like cathode electrode 114.

The ellipse 206 in a dashed line represents the cut-off region of the power lines for supplying the anode power supply potential and the cathode power supply potential from the external. The power lines extend to the end of the insulating substrate 202. As described above, an aging test is performed before the driver IC 134 is mounted and the TFT substrate 100 is cut out from a motherboard. For this reason, the anode power supply potential and the cathode power supply potential are supplied from an external apparatus to the TFT substrate 100 through the power lines.

Configuration of Pixel Circuit

Figure 3A:
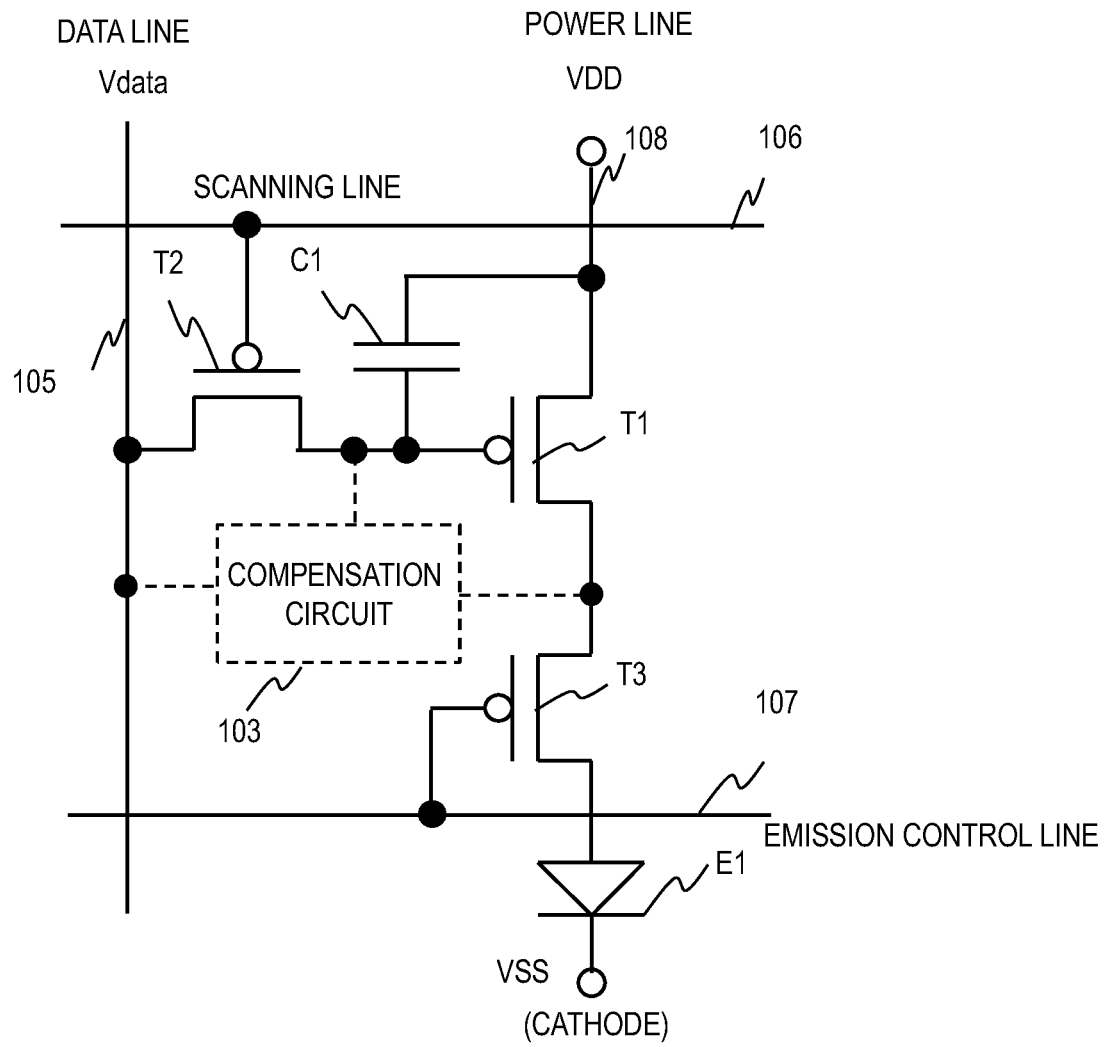
FIG. 3A illustrates a configuration example of a pixel circuit in a normal display region.

A plurality of pixel circuits are fabricated on the TFT substrate 100 to control electric current to be supplied to the anode electrodes of subpixels. FIG. 3A illustrates a configuration example of a pixel circuit in the normal display region 200. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the subpixel. The selection transistor T2 is a p-channel TFT and its gate terminal is connected to a scanning line 106. The source terminal is connected to a data line 105. The drain terminal is connected to the gate terminal of the driving transistor T1.

The driving transistor T1 is a transistor (driving TFT) for driving the OLED element E1. The driving transistor T1 is a p-channel TFT and its gate terminal is connected to the drain terminal of the selection transistor T2. The source terminal of the driving transistor T1 is connected to a power line 108 for transmitting an anode power supply potential VDD. The drain terminal of the driving transistor T1 is connected to the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected to an emission control line 107. The source terminal of the emission transistor T3 is connected to the drain terminal of the driving transistor T1. The drain terminal of the emission transistor T3 is connected to the OLED element E1. The cathode of the OLED element E1 is supplied with a cathode power supply potential VSS.

The pixel circuit includes a threshold voltage compensation circuit 103. The threshold voltage compensation circuit 103 compensates for the variation in threshold voltage of the driving transistor T1. The threshold voltage compensation circuit 103 includes a plurality of thin-film transistors. There are various known circuit configurations for the threshold voltage compensation circuit 103; a desirable circuit configuration can be employed.

Next, operation of the pixel circuit is described. The scanning driver 131 outputs a selection pulse to the scanning line 106 to turn on the selection transistor T2. The data voltage supplied from the driver IC 134 through the data line 105 is adjusted by the threshold voltage compensation circuit 103 depending on the threshold voltage of the driving transistor T1 and stored to the storage capacitor C1. The storage capacitor C1 holds the stored voltage throughout the period of one frame. The conductance of the driving transistor T1 changes in an analog manner in accordance with the stored voltage, so that the driving transistor T1 supplies a forward bias current corresponding to a gray level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 3B:
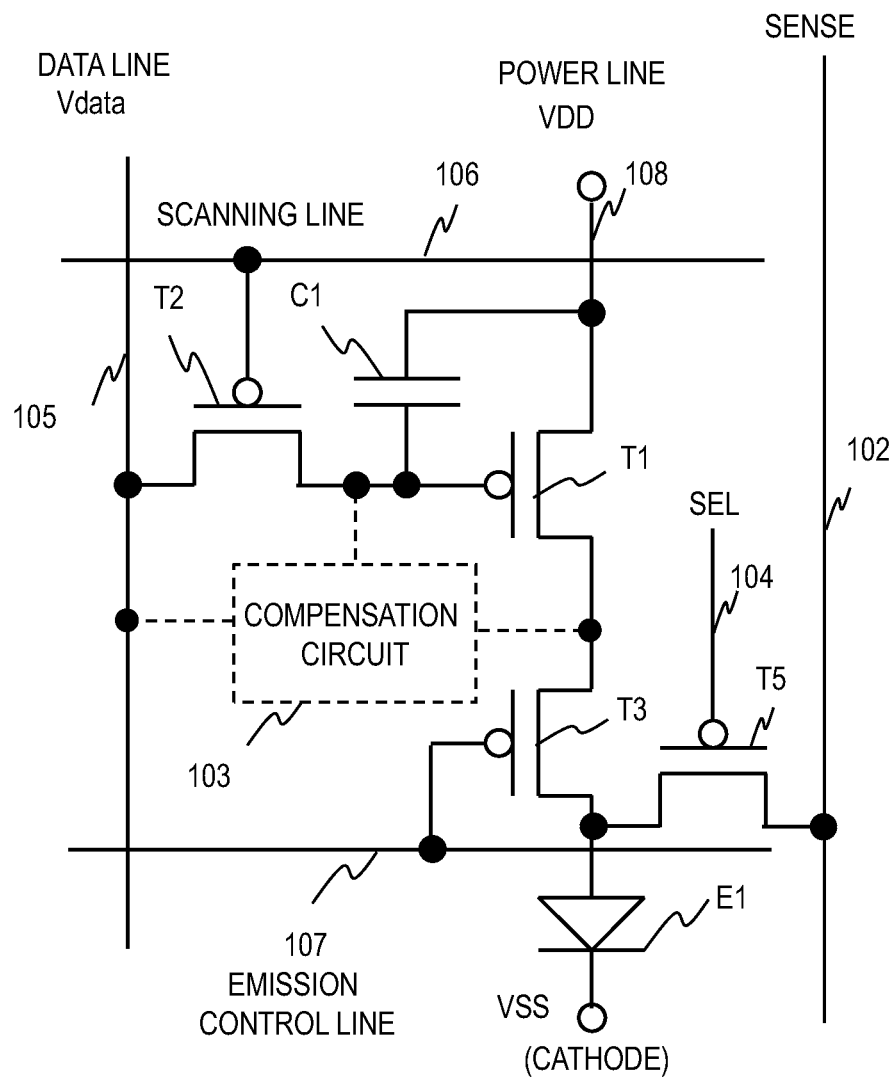
FIG. 3B illustrates a configuration example of a pixel circuit in a first deterioration evaluation region and a second deterioration evaluation region.

FIG. 3B illustrates a configuration example of a pixel circuit in the first deterioration evaluation regions 211 and the second deterioration evaluation regions 212. Compared to the pixel circuit in the normal display region 200 in FIG. 3A, the pixel circuit in FIG. 3B has a configuration such that another switching transistor T5 is added. The switching transistor T5 is a switching transistor for evaluating the deterioration of the OLED element E1; it connects a sense line 102 and the anode of the OLED element E1.

Specifically, one of source and drain of the switching transistor T5 is connected to a node between the anode of the OLED element E1 and the transistor T3 and the other of the source and drain is connected to a sense line 102. The gate of the switching transistor T5 is connected to a selection line 104 for transmitting a selection signal SEL.

The transistor T5 is turned ON/OFF by the selection signal SEL and the sense line 102 transmits a deterioration measurement signal SENSE. Evaluating the deterioration of the OLED element E1 supplies a predetermined data signal to the storage capacitor C1, turns on the switching transistor T5, and measures the voltage (deterioration measurement signal SENSE) of the OLED element E1 with the sense line 102. Alternatively, the evaluation can be made by supplying a current from the driver IC 134 through the sense line 102 and measuring the voltage of the OLED element E1, using a period where the transistor T3 is not ON.

As described above, the pixel circuits in the normal display region 200 and the pixel circuits for the dummy pixels in the deterioration evaluation regions 211 and 212 are identical in the part for controlling light emission of an OLED element E1. The pixel circuits for dummy pixels include a circuit for deterioration evaluation in addition to the circuit configuration of the pixel circuits in the normal display region 200. Hence, the deterioration statuses of the pixel circuits in the normal display region 200 can be inferred more accurately.

The pixel circuits in FIGS. 3A and 3B are examples; the pixel circuits can have other circuit configurations. Although the pixel circuits in FIGS. 3A and 3B employ p-channel TFTs, they can employ n-channel TFTs.

Variation in Characteristics of OLED Elements

Figure 4A:
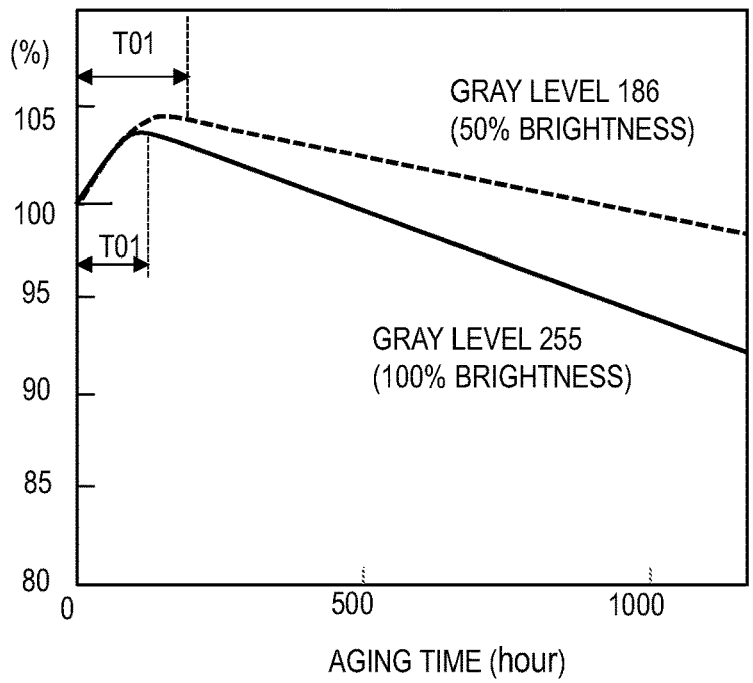
FIG. 4A illustrates examples of the relation between the time of high-temperature aging and the relative luminance of an OLED element for a red subpixel.
Figure 4B:
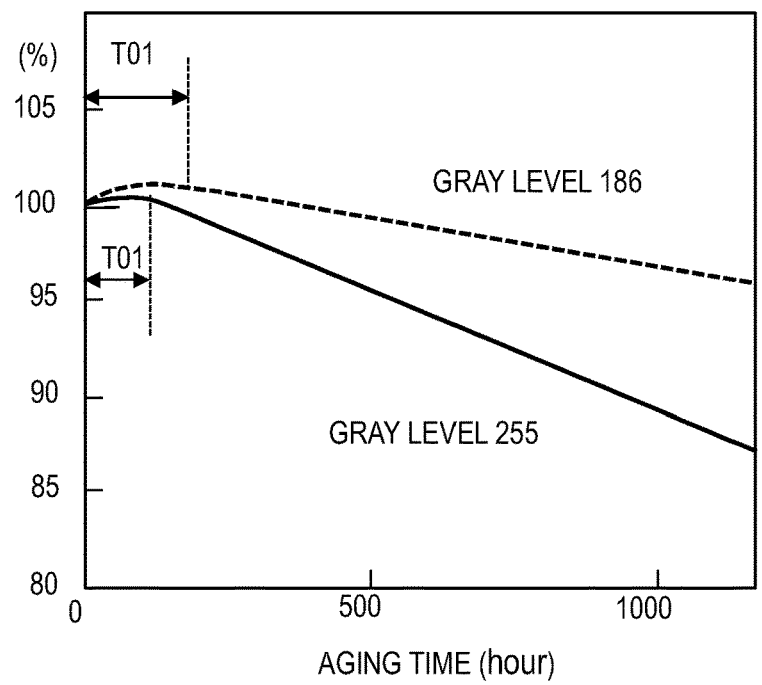
FIG. 4B illustrates examples of the relation between the time of high-temperature aging and the relative luminance of an OLED element for a green subpixel.
Figure 4C:
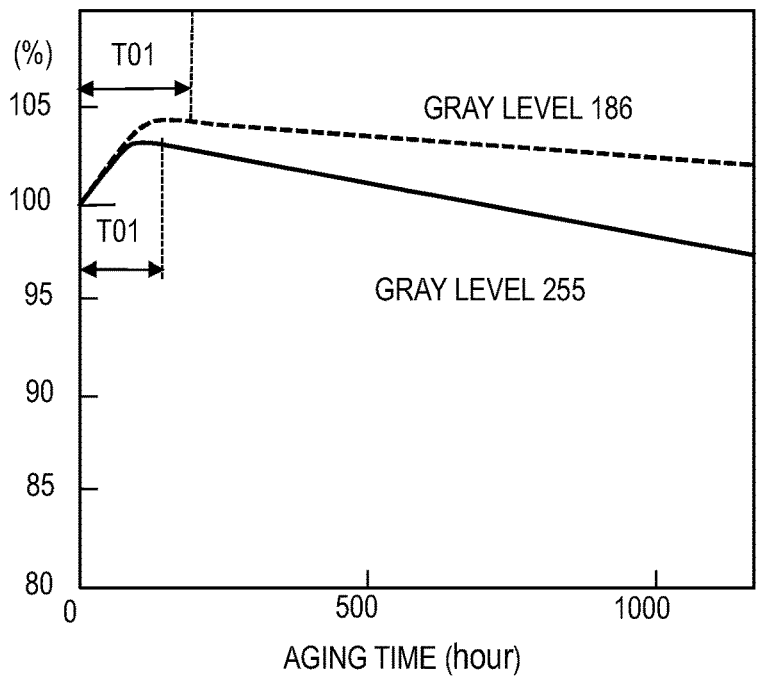
FIG. 4C illustrates examples of the relation between the time of high-temperature aging and the relative luminance of an OLED element for a blue subpixel.

Hereinafter, temporal variation in deterioration of OLED elements is described. FIGS. 4A to 4C illustrate examples of the relation between the time of high-temperature aging and the relative luminance of OLED elements for a red subpixel, a green subpixel, and a blue subpixel, showing temporal variation in relative luminance of the OLED elements driven and controlled by pixel circuits. In each graph, the horizontal axis represents aging time and the vertical axis represents relative luminance. The aging time is the time elapsed since the OLED element started emitting light. The relative luminance is defined so that the initial value is 100.

In each of FIGS. 4A to 4C, the variation in relative luminance at the gray level of 255 is represented by a solid line and the variation in relative luminance at the gray level of 186 is represented by a dashed line. The gray level 255 is the highest gray level and corresponds to the maximum luminance (100%). The gray level 186 is an intermediate level and corresponds to the luminance of 50%. The gray levels correspond to the levels of the data signals supplied to the pixel circuits.

As indicated in FIGS. 4A to 4C, the relative luminance increases upon start of emission and decreases subsequently in the cases of any color and gray level. The time showing temporal variation in relative luminance can be separated into two periods: an initial deterioration period T01 since the start of driving and a steady deterioration period following the initial deterioration period T01. The variation in characteristics in the initial deterioration period T01 can be referred to as initial deterioration mode and the variation in characteristics in the steady deterioration period as steady deterioration mode.

The steady deterioration mode is a mode where the relative luminance decreases at a substantially constant rate. The initial deterioration mode is a mode preceding the steady deterioration mode. The initial deterioration mode exhibits more complex variation in relative luminance than the steady deterioration mode. The examples in FIGS. 4A to 4C exhibit initial increase and subsequent decrease in relative luminance. The point where the relative luminance starts varying constantly can be determined to be the transition point between the two deterioration modes.

As noted from FIGS. 4A to 4C, the relative luminance varies with time differently depending on the color of the subpixel. Further, the relative luminance varies with time differently depending on the gray level. For example, the length of the initial deterioration period T01 is different depending on the color and further, depending on the gray level of the same color. The relative luminance at the gray level of 186 increases to a larger value in the initial deterioration period T01 and decreases at a lower rate in the steady deterioration period than the relative luminance at the gray level of 255. Note that FIGS. 4A to 4C provide examples of temporal variation in relative luminance; the actual temporal variation is different depending on the panel.

Figure 5A:
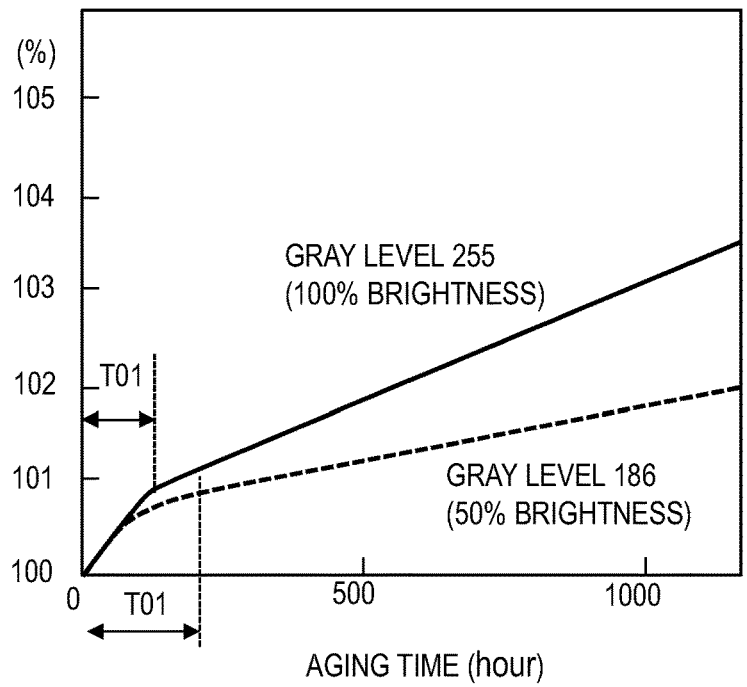
FIG. 5A illustrates examples of the relation between the time of high-temperature aging and the relative driving voltage of an OLED element for a red subpixel.
Figure 5B:
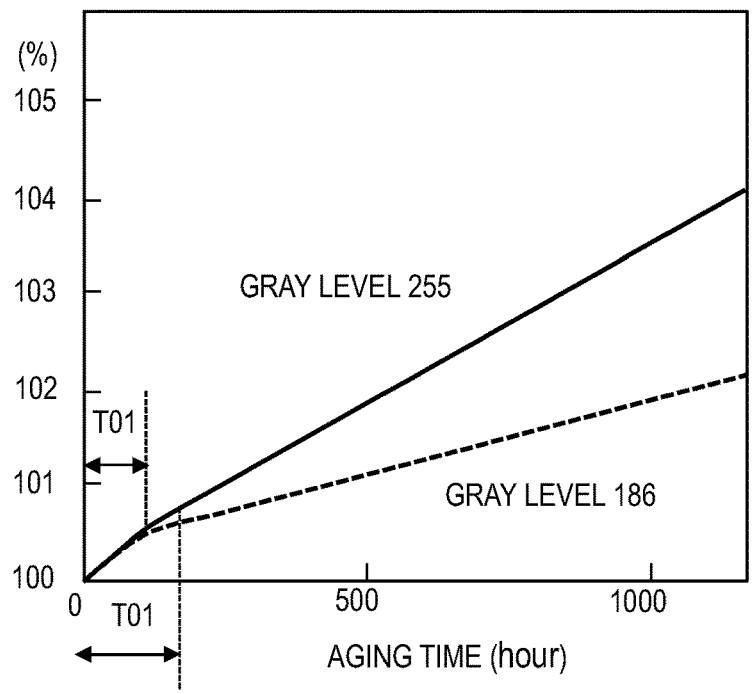
FIG. 5B illustrates examples of the relation between the time of high-temperature aging and the relative driving voltage of an OLED element for a green subpixel.
Figure 5C:
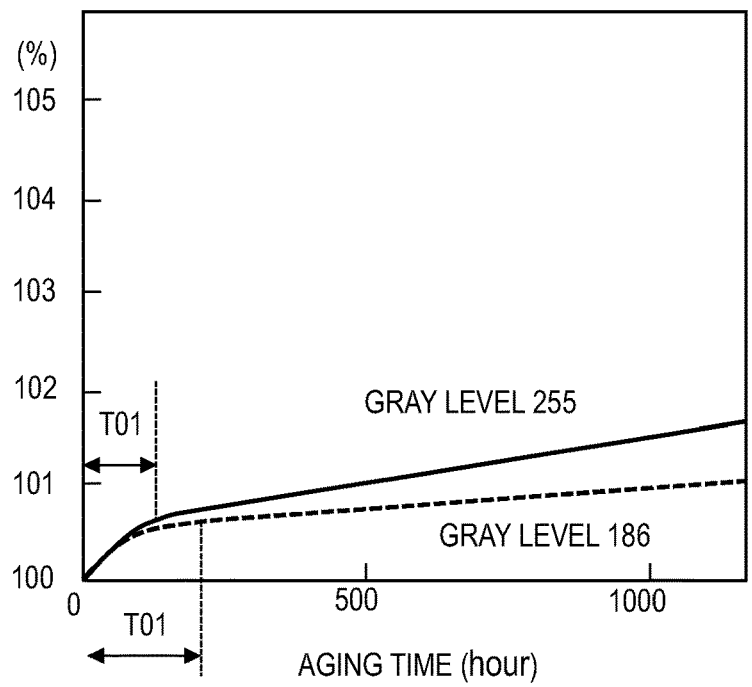
FIG. 5C illustrates examples of the relation between the time of high-temperature aging and the relative driving voltage of an OLED element for a blue subpixel.

Next, the relation between the driving voltage and the aging time of an OLED element is described. The driving voltage of an OLED element is the voltage between the anode and the cathode of the OLED element. FIGS. 5A to 5C illustrate examples of the relation between the time of high-temperature aging and the relative driving voltage of LED elements for a red subpixel, a green subpixel, and a blue subpixel, showing temporal variation in relative driving voltage of the OLED elements driven and controlled by pixel circuits. FIGS. 5A to 5C were obtained from the same OLED elements that provided FIGS. 4A to 4C.

In each graph of FIGS. 5A to 5C, the horizontal axis represents aging time and the vertical axis represents driving voltage of the OLED element. The aging time is the time elapsed since the OLED element started emitting light. The relative driving voltage is defined so that the initial value is 100. In FIGS. 5A to 5C, the initial deterioration period is denoted by a reference sign T01.

As noted from FIGS. 5A to 5C, the steady deterioration mode is a mode exhibiting substantially constant increase in relative driving voltage and the initial deterioration mode is a mode preceding the steady deterioration mode. The initial deterioration mode exhibits more complex variation than the steady deterioration mode. The initial deterioration mode in the examples in FIGS. 5A to 5C first exhibits a high increasing rate of the relative driving voltage and subsequently, a lower increasing rate. The point where the relative driving voltage starts varying constantly can be determined to be the transition point between the two deterioration modes As noted from FIGS. 5A to 5C, the relative driving voltage varies with time differently depending on the color of the subpixel. Further, the relative driving voltage varies differently depending on the gray level. For example, the length of the initial deterioration period T01 is different depending on the color and further, depending on the gray level of the same color. The relative driving voltage at the gray level of 255 increases to a larger value in the initial deterioration period T01 and further increases at a higher rate in the steady deterioration period than the relative driving voltage at the gray level of 186. Note that FIG. 5A to 5C provide examples of temporal variation in relative driving voltage; the actual temporal variation is different depending on the panel.

The relative driving current of an OLED element exhibits specific variation with respect to the aging time. The driving current is current that flows in the OLED element under a constant voltage. Accordingly, the deterioration of the OLED element can be inferred by measuring the driving current, instead of the driving voltage.

Figure 6A:
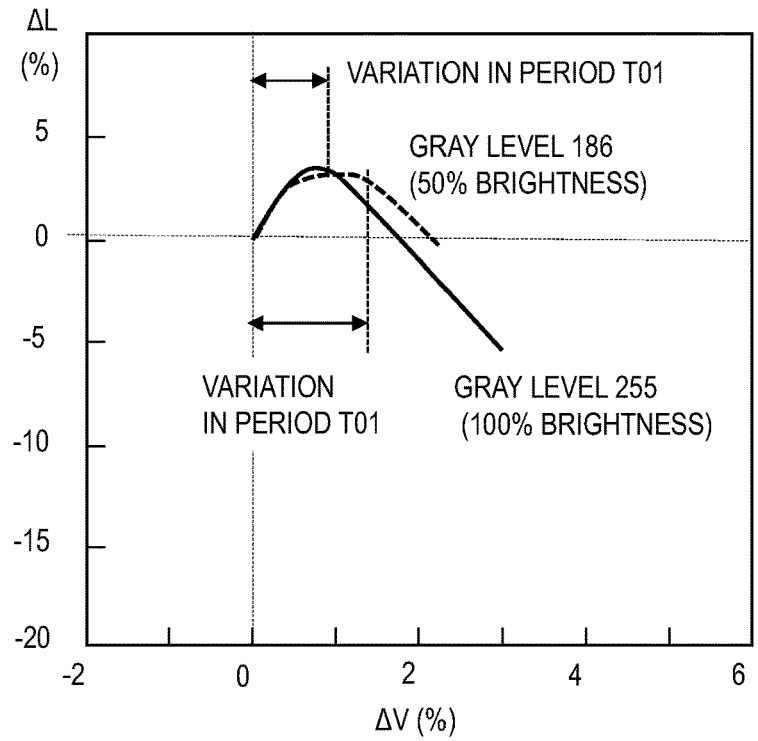
FIG. 6A illustrates examples of the relation between the relative driving voltage and the relative luminance of an OLED element for a red subpixel.
Figure 6B:
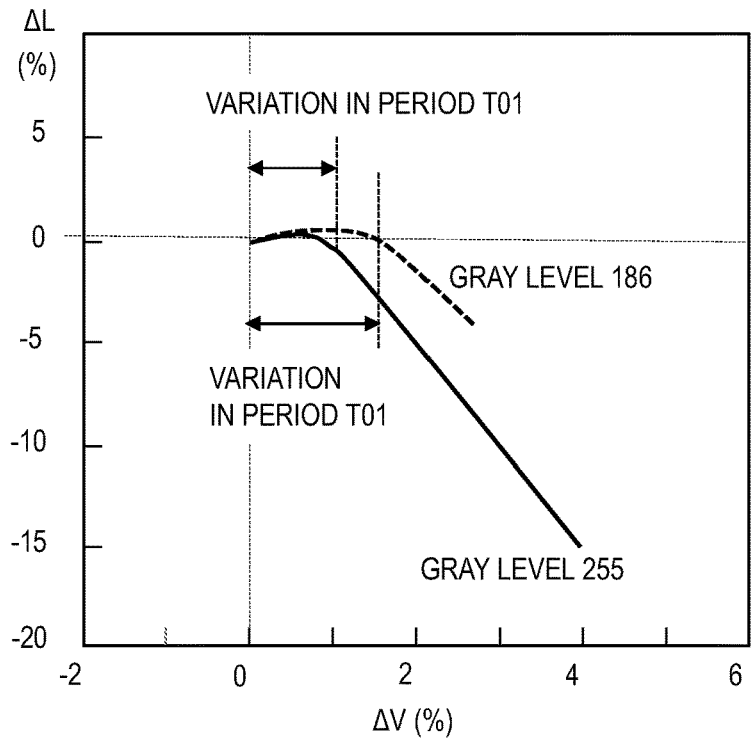
FIG. 6B illustrates examples of the relation between the relative driving voltage and the relative luminance of an OLED element for a green subpixel.
Figure 6C:
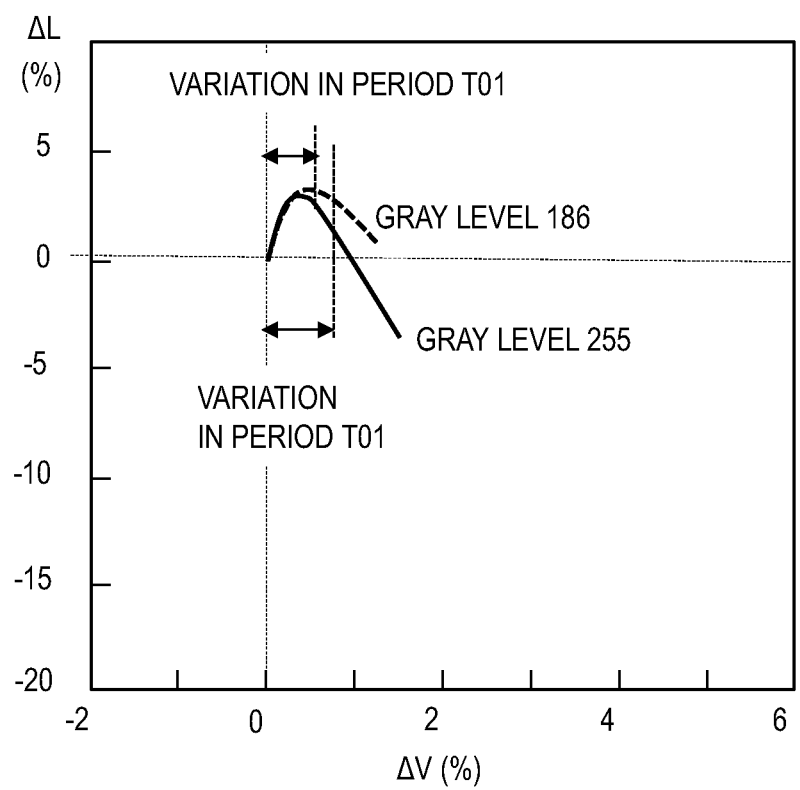
FIG. 6C illustrates examples of the relation between the relative driving voltage and the relative luminance of an OLED element for a blue subpixel.

FIGS. 6A to 6C schematically illustrate relations between the relative driving voltage and the relative luminance of OLED elements. In each graph of FIGS. 6A to 6C, the horizontal axis represents relative driving voltage and the vertical axis represents relative luminance. In FIGS. 6A to 6C, the initial deterioration period is denoted by a reference sign T01.

FIGS. 6A to 6C illustrate examples of the relation between the relative driving voltage and the relative luminance of OLED elements for a red subpixel, a green subpixel, and a blue subpixel. The data in FIG. 6A is obtained from the data in FIGS. 4A and 5A. The data in FIG. 6B is obtained from the data in FIGS. 4B and 5B. The data in FIG. 6C is obtained from the data in FIGS. 4C and 5C.

Emission Control Depending on Deterioration Status of OLED Element

As illustrated in FIGS. 4A to 4C, the relative luminance varies with aging time. The variation in relative luminance can be different depending on the color and the gray level (data signal level) of the subpixel, and moreover, depending on the TFT substrate 100. In one TFT substrate 100, the subpixels of the same color exhibit substantially the same variation in relative luminance with respect to the aging time at each gray level.

An embodiment of this specification performs deterioration evaluation on the first deterioration evaluation regions 211 in a manufacturing step before shipment. More specifically, the deterioration evaluation measures the variation in relative luminance with respect to aging time of subpixels of each color lit at different gray levels in the first deterioration evaluation regions 211.

The designer creates adjustment information indicating the relation between the driving history (driving) of a subpixel and the adjustment amount for a data signal from the results of the deterioration evaluation at a plurality of different gray levels exemplified in FIGS. 4A to 4C. The designer can determine more appropriate adjustment amounts by referring to the results of measurement of the variation in driving voltage shown in FIGS. 5A to 5C together. The adjustment information is included in the OLED display device 10. The OLED display device 10 records the driving history of each subpixel in the normal display region 200 and adjusts a data signal based on the driving history and the adjustment information.

In the following, two methods for adjusting a data signal are mainly described. One method determines the adjustment amount for a data signal for a subpixel in the normal display region 200 with reference to the results of post-shipment deterioration evaluation on the second deterioration evaluation regions 212 together with adjustment information. The other method determines the adjustment amount for a data signal for a subpixel in the normal display region 200 without referring to the results of deterioration evaluation on the second deterioration evaluation regions 212. The OLED display device 10 employing the latter method does not need to include the second deterioration evaluation regions 212.

First, the adjustment method without referring to the results of deterioration evaluation on the second deterioration evaluation regions 212 is described. The designer can determine the relation between the deterioration status and the variation in relative luminance of subpixels of each color from the evaluation results on the first deterioration evaluation regions 211 and further, determine the adjustment amount for a data signal depending on the variation in relative luminance. A data signal can be adjusted by adjusting the gray level, for example.

The deterioration status of a subpixel is calculated from the driving history of the subpixel. The deterioration status can be expressed using a standard gray level and the driving time (operating time). As described with reference to FIGS. 4A to 6C, if the subpixel keeps lighting at a fixed gray level, the fixed gray level is the standard gray level and the lighting time is the driving time. In an aging test, a predetermined fixed gray level is the standard gray level and the aging time is the driving time.

The gray level (data signal) for a subpixel in the normal display region 200 is not fixed but is changed momentarily. The deterioration status can normalize the driving history of a subpixel that is driven variously. The deterioration status of a subpixel is calculated based on its driving history. The driving history indicates the temporal variation of the gray level assigned to the subpixel.

A simple method determines the time average of gray levels in the driving history to be the standard gray level. The driving time is the total time in which data signals based on gray levels are supplied to the subpixels. The driving time can be the total operating time of the device. The methods of calculating the standard gray level and the driving time are not limited to these; appropriate methods can be determined depending on the design. The deterioration status can be expressed using one or more variables representing feature values different from the combination of the standard gray level and the driving time. For example, temperature information can be included.

Adjustment information indicating the relation between the driving history and the adjustment amount for a data signal is included in the OLED display device 10. As described above, the adjustment information is configured based on the evaluation results on the first deterioration evaluation regions 211. The OLED display device 10 adjusts data signals for the subpixels of each color in the normal display region 200, using the adjustment information.

The adjustment information enables determining the adjustment amount for a data signal for a subpixel from the driving history of the subpixel and the gray level (the intensity level in an image) for the subpixel specified in the video frame to be displayed next. For example, the driving history can include the total lighting times at individual gray levels in the past. The OLED display device 10 calculates a deterioration status from the driving history using a function included in the adjustment information, for example. Moreover, the OLED display device 10 determines the adjustment amount for a data signal, for example, the adjustment amount for the intensity level in the image from the determined deterioration status and the intensity level in the image with reference to the adjustment information.

The OLED display device 10 holds adjustment information for each color. The OLED display device 10 records the driving histories of individual subpixels and determines the adjustment amounts for data signals from the driving histories and the intensity levels in an image, based on the adjustment information.

As described with reference to FIGS. 4A to 4C, an OLED element deteriorates in significantly different manners in between the initial deterioration mode (initial deterioration period) and the steady deterioration mode (steady deterioration period). Accordingly, for emission control of the normal display region 200, it is important for the OLED display device 10 to identify the deterioration mode of each subpixel and adjust a data signal by the method suitable for the deterioration mode.

In an embodiment of this specification, the OLED display device 10 determines the deterioration status of each subpixel based on the driving history of the subpixel. A subpixel is determined to be in the initial deterioration period (initial deterioration mode) during the period from the start of operation after shipment until the deterioration status reaches a predetermined status. When the deterioration status reaches the predetermined status, it is determined that the subpixel has entered a steady deterioration period (steady deterioration mode).

In the case where the deterioration status is expressed by the standard gray level and the driving time, a threshold for the driving time can be assigned to each gray level. When the driving time of a subpixel reaches the threshold for the driving time assigned to its standard gray level, it is determined that the deterioration of the subpixel turns from an initial deterioration mode to a steady deterioration mode The OLED display device 10 adjusts data signals for subpixels with reference to the adjustment information prepared for each color. The adjustment information includes adjustment information prepared for the initial deterioration period and adjustment information prepared for the steady deterioration period. As described with reference to FIGS. 4A to 4C, the relative luminance varies in a complex manner during the initial deterioration period and decreases in a substantially constant manner during the steady deterioration period.

In an embodiment of this specification, the adjustment information for the initial deterioration period is a lookup table providing relations between a deterioration status and an adjustment amount. This configuration enables adjustment appropriate for the complex variation in relative luminance. The adjustment information for the steady deterioration period can be a predefined function. This configuration can save the memory area for adjustment. The adjustment information for the steady deterioration period can include a lookup table different from the lookup table for the initial deterioration period.

When a subpixel is in an initial deterioration period, the OLED display device 10 determines the adjustment amount with reference to the lookup table. As soon as the subpixel enters a steady deterioration mode, the OLED display device 10 switches the emission control for the subpixel from the one for initial deterioration mode to the one for steady deterioration mode. The emission control for the steady deterioration mode in an embodiment of this specification regards the status of a subpixel when the subpixel enters the steady deterioration mode as a nominal initial status to control its light emission. The OLED display device 10 uses the driving history in the steady deterioration period only without referring to the driving history before entering the steady deterioration period. For example, the adjustment amount is determined by a lookup table or a function using the driving time and the average gray level in the period since the start of the steady deterioration mode and the intensity level in the image as inputs.

In the case where the adjustment of a data signal for the normal display region 200 does not refer to the post-shipment evaluation results on the dummy pixels, the second deterioration evaluation regions 212 can be excluded as described above. Furthermore, the first deterioration evaluation regions 211 can be cut off from the TFT substrate 100 after deterioration evaluation on the first deterioration evaluation regions 211 is finished, if possible for the manufacture.

The other method of controlling light emission of the normal display region 200 is described. This method refers to the results of post-shipment deterioration evaluation on the second deterioration evaluation regions 212 in addition to the results of pre-shipment deterioration evaluation on the first deterioration evaluation regions 211. This configuration enables more appropriate light emission control for the normal display region 200. The deterioration evaluation measures the current-voltage characteristic of the OLED elements in the second deterioration evaluation regions 212. The details of the emission control and the deterioration evaluation for the second deterioration evaluation regions 212 will be described later.

As described with reference to FIGS. 5A to 5C, the relative driving voltage of an OLED element varies with aging time characteristically in each of the initial deterioration mode and the steady deterioration mode. Furthermore, as described with reference to FIGS. 6A to 6C, the relative luminance of each color exhibits a specific relation with the driving voltage in each TFT substrate 100. Accordingly, more appropriate deterioration compensation in the normal display region 200 becomes available by comparing the results of measurement of the driving voltage in the first deterioration evaluation regions 211 with the results of measurement of the driving voltage in the second deterioration evaluation regions 212.

The measurement results from the second deterioration evaluation regions 212 can be utilized in some ways. An example of the usage is to infer whether a subpixel in the normal display region 200 turns from the initial deterioration mode to the steady deterioration mode. Another example of the usage is to calculate the adjustment amount for a data signal in the steady deterioration period.

Still another example of the usage is to calculate the adjustment amount for a data signal in the initial deterioration period. One or more, including all, of these usages can be applied to the OLED display device 10. The detailed method of using the measurement results from the second deterioration evaluation regions 212 will be described later.

Pre-Shipment Aging Test

Hereinafter, a pre-shipment aging test for evaluating the deterioration in the first deterioration evaluation regions 211 is described. Consultation information for deterioration compensation in the normal display region 200 is generated from the results of this deterioration evaluation and set to the OLED display device 10.

The aging test can be conducted under a deterioration accelerating condition to reduce the time for the deterioration evaluation. Examples of the deterioration accelerating condition can include high temperature, high driving voltage to OLED elements, and a high data signal level for pixel circuits.

The aging test in an embodiment of this specification divides the subpixels of the same color in the first deterioration evaluation regions 211 on each TFT substrate into a plurality of groups and supplies a different level of data signals to each group. The different data signal levels under the accelerating condition correspond to different gray levels under normal use condition.

The aging test measures the luminance and the driving voltage of the subpixel groups of each color provided with different levels of data signals. The luminance of each subpixel group can be measured with a spot sensor moved to sense a spot of light or an area sensor and the variation of the luminance of each subpixel group is measured. Measurement of luminance with a spot sensor can keep the groups other than the subpixel group subject to measurement in a non-lighting state.

The driving voltage of an OLED element is measured through the pixel circuit therefor. As illustrated in FIG. 3B, a pixel circuit in the first deterioration evaluation regions 211 includes a switching transistor T5 for deterioration evaluation on an OLED element E1. The switching transistor T5 is kept OFF in the emission control to advance the deterioration of the OLED element E1. The switching transistor T5 is kept ON when the deterioration evaluation on the OLED element E1 is being performed.

The aging control writes a predetermined data signal to the pixel circuit selected with a scanning line 106 through a data line 105 and keeps the switching transistor T3 ON to light the OLED element E1. The deterioration evaluation selects a pixel circuit to be evaluated with a selection line 104 and keeps the switching transistor T5 ON. Among the pixel circuits connected to a sense line 102, all pixel circuits except for the pixel circuit to be evaluated are supplied with a selection signal SEL to keep their switching transistors T5 OFF.

The sense line 102 transmits a deterioration measurement signal of each subpixel. The deterioration measurement signal indicates the anode potential of an OLED element E1. The cathode potential is fixed. For this reason, the deterioration measurement signal represents the driving voltage of the OLED element E1. Instead of the driving voltage under constant current, the driving current under a low voltage can be measured.

The aging test measures the temporal variation of the luminance and the driving voltage for each combination of a data signal level and a color. The aging test calculates the averages of the luminance values and the driving voltages of the subpixels in each subpixel group. The variation of these averages represents the variation of the luminance and the driving voltage for each combination of a data signal level and a color.

The aging test is continued until all subpixels exhibit a steady deterioration mode. The data acquired from the aging test is used to determine the relation between the deterioration level and the adjustment amount for a data signal for subpixels of each color in each of the initial deterioration mode and the steady deterioration mode.

Figure 7:
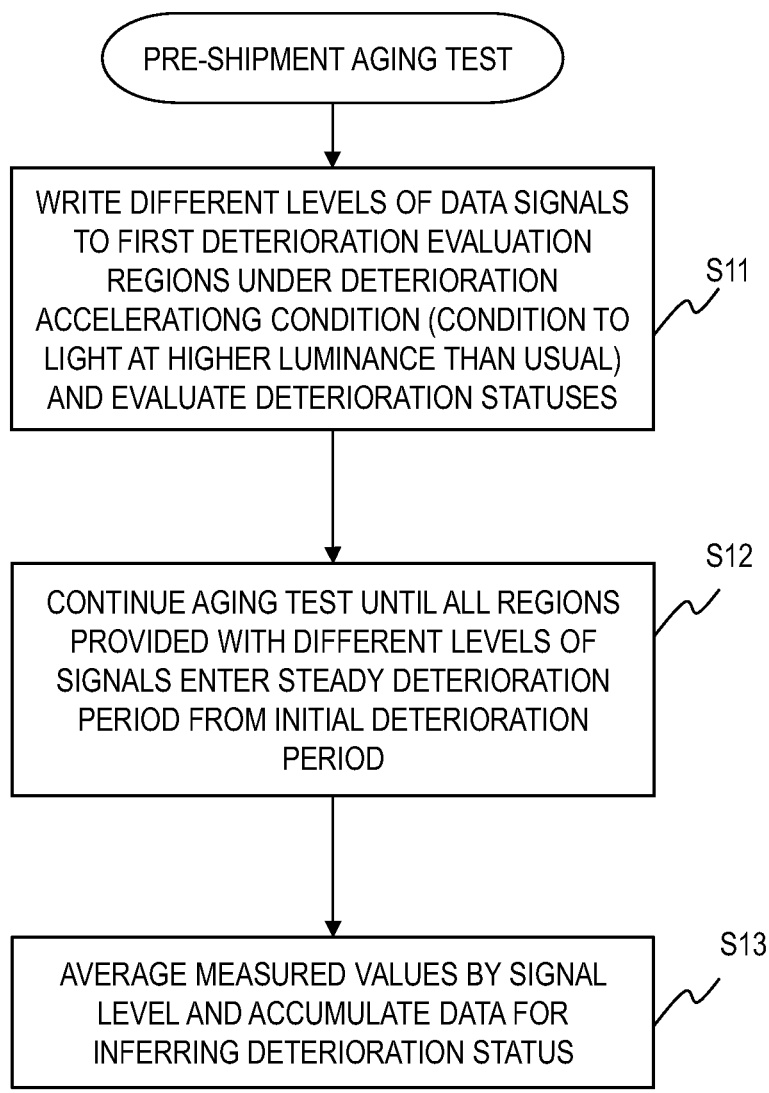
FIG. 7 is a flowchart of an example of an aging test.

The aging test is conducted by an external test system. FIG. 7 is a flowchart of an example of the aging test. The test system writes a plurality of levels of data signals to the first deterioration evaluation regions 211 under a deterioration accelerating condition (a condition to light the subpixels brighter than the highest level in the normal operation) and evaluates the deterioration statuses (S11).

The test system continues the aging test until it determines that all subpixel groups provided with data signals at different levels have entered a steady deterioration period from an initial deterioration period (S12). The test system averages the measurement results by data signal level and accumulates the data for inferring the deterioration status (S13).

As described above, the measurement data indicates the variation in luminance and current-voltage characteristic of subpixels of each color at each data signal level. Accordingly, identification of an initial deterioration mode or a steady deterioration mode can be made appropriately. Further, the speed of deterioration after entering the steady deterioration mode can be monitored by data signal level to feed back the monitoring result to a deterioration calculation formula in normal displaying operation.

Figure 8:
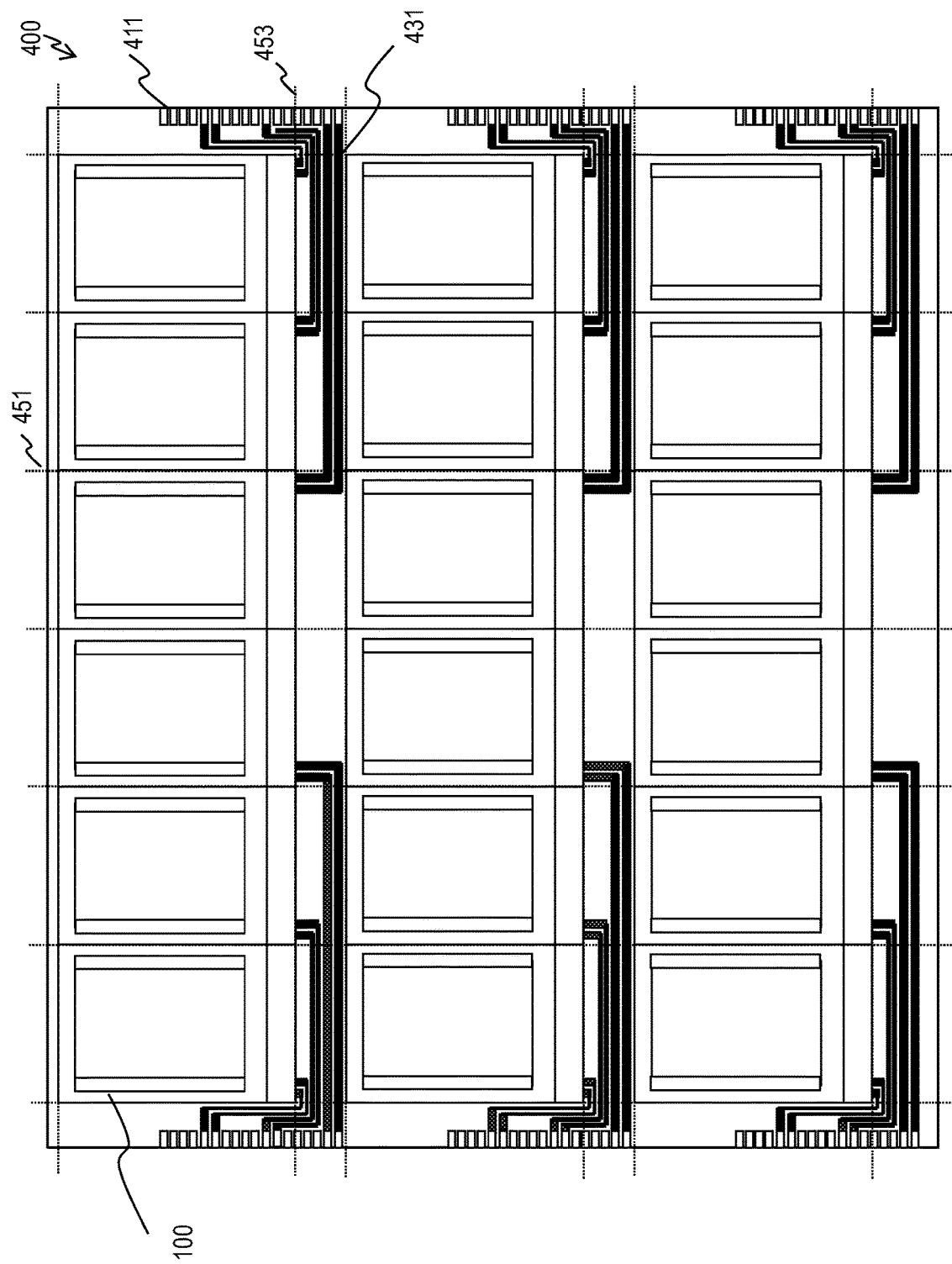
FIG. 8 is a plan diagram illustrating a configuration example of a motherboard subject to an aging test.

FIG. 8 is a plan diagram illustrating a configuration example of a motherboard 400 subject to an aging test. The motherboard 400 includes a plurality of TFT substrates 100 before driver ICs 134 are mounted. In FIG. 8, one of the TFT substrate before being cut out is provided with a reference sign 100 by way of example. The motherboard 400 in the configuration example in FIG. 8 includes a plurality of pads 411 for an aging test in a region outside the TFT substrates 100. The pads 411 are disposed along ends of the motherboard 400 and transmission lines 431 extend from the pads 411 to the TFT substrates 100. In FIG. 8, one of the pads and one of the transmission lines are provided with reference signs 411 and 431, respectively, by way of example. FIG. 8 shows only some of the pads 411 and the transmission lines 431.

A not-shown test system makes a plurality of pins of its connection device contact the pads 411 and supplies power supply potentials and control signals to the first deterioration evaluation regions 211 of the plurality of TFT substrates 100 together. A transmission line 431 is connected to a transmission line in the elliptical region 204, 205 or 206 surrounded by a dashed line in FIGS. 2A and 2B.

Specifically, the test system supplies control signals for the scanning drivers 131, the emission drivers 132, and the aging test circuits 133 and data signals for data lines through control pads 411 and further, supplies an anode power supply potential, a cathode power supply potential, and power supply potentials for the scanning drivers 131, the emission drivers 132, and the aging test circuits 133 through power pads 411.

After the aging test is finished, individual TFT substrates 100 are cut out from the motherboard 400. In FIG. 8, some of the plurality of horizontal cut lines and vertical cut lines are provided with reference signs. Specifically, cut lines 453 extend horizontally and cut lines 451 extend vertically on the motherboard 400 in FIG. 8.

Providing pads and transmission lines outside the TFT substrate region of the motherboard 400 and supplying signals for an aging test to the TFT substrates 100 through them enable an efficient aging test and eliminate the necessity of pads on the TFT substrates.

Figure 9:
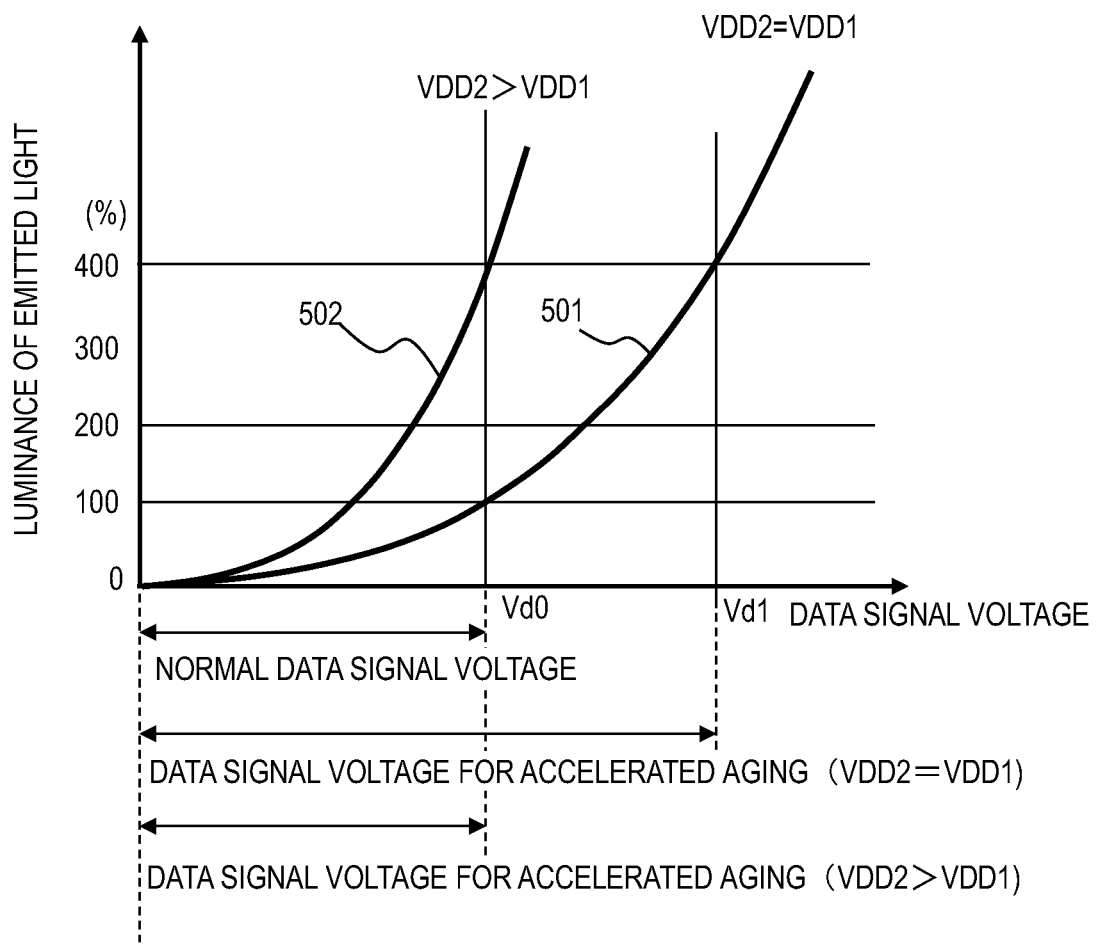
FIG. 9 is a diagram for explaining a technique to supply higher driving voltage in an aging test in response to the same data signal as the one in the normal operation by supplying a higher power supply voltage than in normal operation.

FIG. 9 is a diagram for explaining a technique to supply higher driving voltage in an aging test in response to the same data signal as the one in the normal operation by supplying a higher power supply voltage than in normal operation. For example, to perform an accelerated aging test on the first deterioration evaluation regions 211 at luminance four times as high as the luminance in the normal displaying operation, data signal voltage higher than usual is required, as illustrated in FIG. 9. Subpixels can emit light four times as bright as usual in response to a normal data signal voltage by raising the anode power supply potential.

FIG. 9 is a graph showing the light intensity characteristic at different anode power supply potentials. The X-axis represents data signal voltage and the Y-axis represents the luminance of emitted light. The curve 501 represents the light intensity characteristic of an OLED element when the anode power supply potential VDD2 in an aging test is equal to the anode power supply potential VDD1 in the normal operation. This characteristic is the same as the characteristic of a subpixel in the normal display region 200.

To attain a white level, the subpixels in the normal operation are supplied with a data signal voltage Vd0 and the subpixels in the first deterioration evaluation regions 211 are supplied with a data signal voltage Vd1 in an aging test. In this example, the subpixels in the first deterioration evaluation regions 211 light four times as bright as the subpixels in the normal operation.

The curve 502 represents the light intensity characteristic of a subpixel in a first deterioration evaluation region 211 when the anode power supply potential VDD2 in the first deterioration evaluation regions 211 is higher than the anode power supply potential VDD1 in the normal operation. The luminance of the subpixel in a first deterioration evaluation region 211 reaches 400% in response to the same data signal voltage Vd0 in the normal operation by selecting a specific value for the anode power supply potential VDD2. In other words, the subpixels in the first deterioration evaluation regions 211 can attain quadruple luminance with the same voltage range (for the lowest to the highest luminance) in the normal operation.

Figure 10:
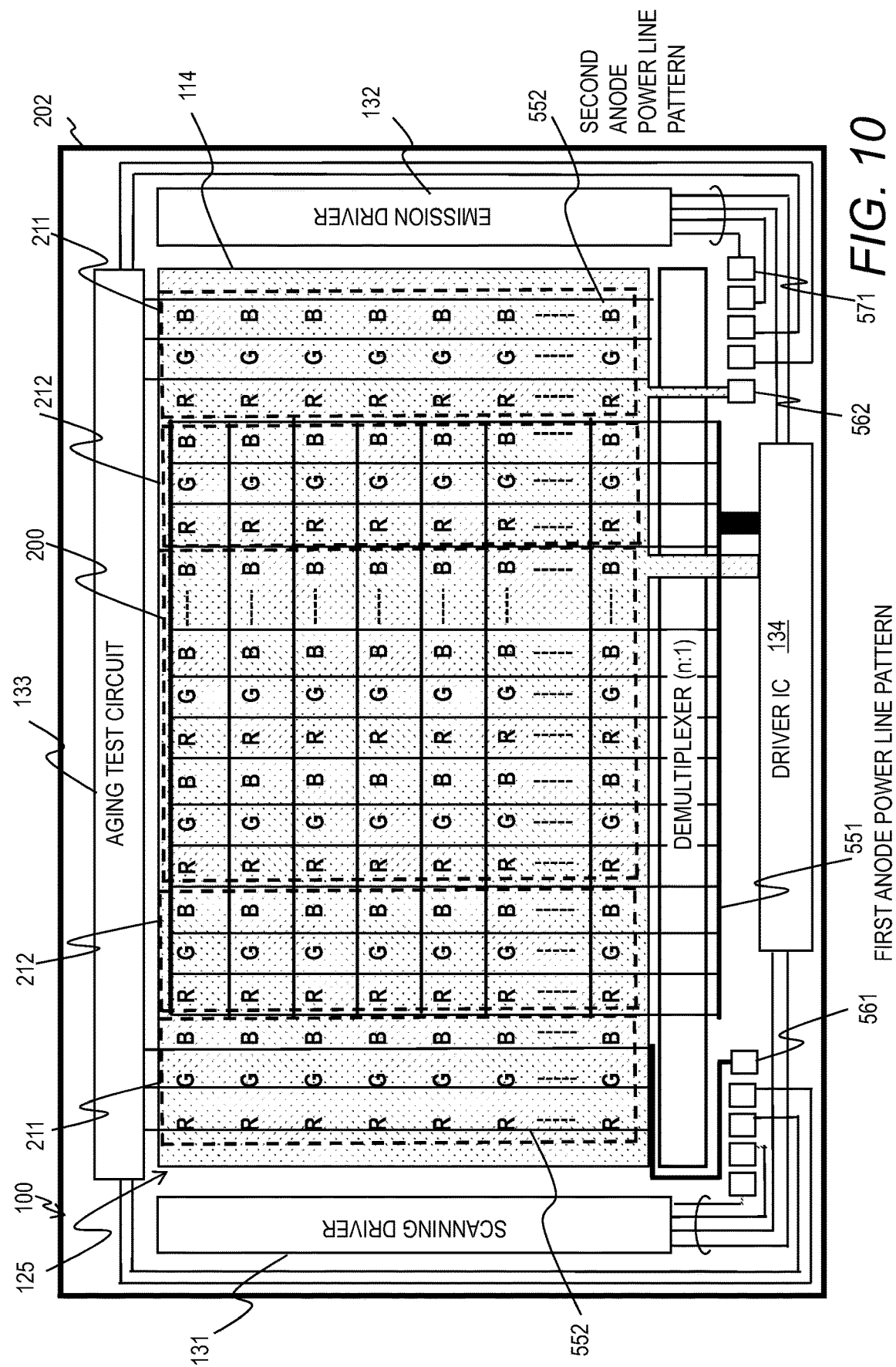
FIG. 10 schematically illustrates an example of the layout of anode power line patterns and a cathode electrode on a TFT substrate.

FIG. 10 schematically illustrates an example of the layout of anode power line patterns and a cathode electrode on a TFT substrate 100. In the configuration example in FIG. 10, the anode power lines for the first deterioration evaluation regions 211 are isolated from the anode power lines for the normal display region 200 and the second deterioration evaluation regions 212.

This configuration enables the first deterioration evaluation regions 211 to be supplied with a higher anode power supply potential than the other regions 200 and 212 as described with reference to FIG. 9. Making high current flow through OLED elements E1 by applying a driving voltage higher than the one in the normal operation across their anode electrodes and cathode electrodes reduces the time required for an aging test.

The configuration example in FIG. 10 includes pads for the accelerated aging test on the first deterioration evaluation regions 211 on the insulating substrate 202. This configuration allows reduction in wiring area of the motherboard; more TFT substrates can be mounted on the motherboard. The pads for the test can be provided outside the TFT substrate region, as illustrated in FIG. 8.

As illustrated in FIG. 10, the TFT substrate 100 includes a first anode power line pattern 551 and second anode power line patterns 552. The first anode power line pattern 551 supplies an anode power supply potential to the pixel circuits in the normal display region 200 and the second deterioration evaluation regions 212. The second anode power line patterns 552 supply an anode power supply potential to the pixel circuits in the first deterioration evaluation regions 211.

A plurality of aging test pads are provided on the insulating substrate 202 and some of them are provided with reference signs. An anode power pad 561 is to supply a high anode power supply potential to the second anode power line patterns 552. In the example of FIG. 10, the second anode power line pattern adjacent to the scanning driver 131 and the second anode power line pattern adjacent to the emission driver 132 are connected through the aging test circuit 133. If the wiring layout of the insulating substrate 202 has any room, another anode power pad 561 can be provided near the second power line pattern adjacent to the emission driver 132 to input the anode power supply potential to each of the second anode power line patterns.

A cathode power pad 562 is to supply a cathode potential from an external to the cathode electrode 114. A pad 571 is to supply a control signal or a power supply potential to the emission driver 132. As illustrated in FIG. 10, a plurality of pads are provided for the scanning driver 131, the emission driver 132, and the aging test circuit 133.

The driver IC 134 outputs an anode power supply potential VDD1 to the first anode power line pattern 551 and the test system outputs an anode power supply potential VDD2 to the second anode power line patterns 552. The driver IC 134 and the test system output a cathode power supply potential VSS to the cathode electrode 114. The anode power supply potential VDD2 is higher than the anode power supply potential VDD1.

Emission Control for Normal Display Region

Hereinafter, post-shipment emission control for the normal display region 200 is described. The following describes emission control that uses adjustment information based on the results of the pre-shipment aging test on the first deterioration evaluation regions 211 and further, the results of post-shipment deterioration evaluation on the second deterioration evaluation regions 212. The results of post-shipment deterioration evaluation on the first deterioration evaluation regions 211 can also be used.

Figure 11:
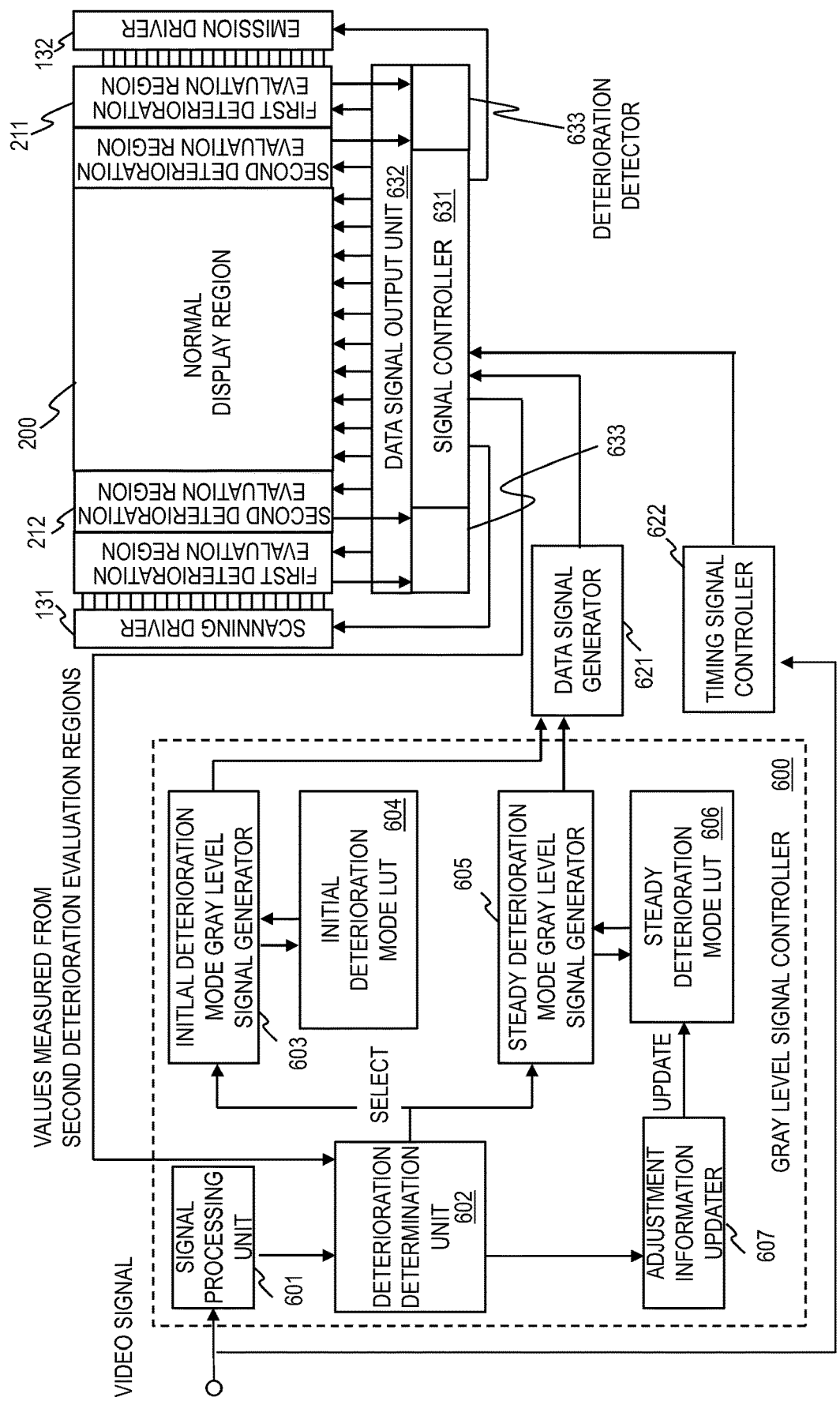
FIG. 11 schematically illustrates a logical configuration of an OLED display device.

FIG. 11 schematically illustrates a logical configuration of the OLED display device 10. A gray level signal controller 600, a data signal generator 621, a timing signal controller 622, a signal controller 631, a data signal output unit 632, and a deterioration detector 633 can be included in the driver IC 134. Each logical function unit can be implemented by a hardware circuit or a combination of hardware and software. The aging test circuit 133 does not need to be used in the operation after shipment. Accordingly, FIG. 11 does not include the aging test circuit 133. The aging test circuit 133 can be used for controlling or evaluating the deterioration evaluation regions.

The gray level signal controller 600 generates gray level signals for individual subpixels from a video signal received from an external controller. The video signal includes successive frames; gray level signals for individual subpixels are generated from each frame. A gray level signal specifies a gray level of a subpixel.

The data signal generator 621 generates data signals in accordance with the gray level signals from the gray level signal controller 600. The data signals for displaying a video frame are supplied to the normal display region 200 through the signal controller 631 and the data signal output unit 632. The data signal generator 621 supplies data signals for deterioration evaluation to the first deterioration evaluation regions 211 and the second deterioration evaluation regions 212. The data signals for the first deterioration evaluation regions 211 are optional.

The deterioration detector 633 detects current/voltage values from the second deterioration evaluation regions 212. In the case where the pixel circuit configuration in FIG. 3B is employed, the deterioration detector 633 detects the driving voltage value of each OLED element under a constant current. The deterioration detector 633 can detect the driving current value of each OLED element under a constant voltage and also detect the current/voltage values from the first deterioration evaluation regions 211. The results of the detection by the deterioration detector 633 are transferred to a deterioration determination unit 602 through the signal controller 632.

The timing signal controller 622 generates and outputs a timing signal for controlling the timing of scanning signals, emission control signals, and data signals. The timing signal is supplied to the signal controller 631 and further to the scanning driver 131 and the emission driver 132 through the signal controller 631.

The gray level signal controller 600 adjusts the gray levels specified in video data depending on the deterioration statuses of subpixels to generate adjusted gray level signals for the subpixels in the normal display region 200. The adjustment of the gray levels is based on the adjustment information generated based on the results of the aging test on the first deterioration evaluation regions 211 and the results of the post-shipment deterioration evaluation on the second deterioration evaluation regions 212. This configuration attains more appropriate deterioration compensation in the normal display region 200. The following mainly describes this example.

Another example performs the post-shipment deterioration evaluation on the second deterioration evaluation regions 212 and the first deterioration evaluation regions 211 and performs deterioration compensation in the normal display region 200 based on the evaluation results. Still another example performs deterioration compensation without deterioration evaluation on the second deterioration evaluation regions 212 and the first deterioration evaluation regions 211.

The gray level signal controller 600 includes a signal processing unit 601, the aforementioned deterioration determination unit 602, an initial deterioration mode gray level signal generator 603, an initial deterioration mode lookup table 604, a steady deterioration mode gray level signal generator 605, a steady deterioration mode lookup table 606, and an adjustment information updater 607.

The signal processing unit 601 determines gray levels of individual subpixels for each frame in accordance with the video signal input from the external. The deterioration determination unit 602 records the driving histories of individual subpixels and determines the deterioration mode of each subpixel based on its driving history. The deterioration determination unit 602 further generates information necessary to adjust the gray levels. The deterioration determination unit 602 determines whether each subpixel is in an initial deterioration mode or a steady deterioration mode based on the current/voltage values measured from the second deterioration evaluation regions 212 and the driving history of the subpixel.

If a subpixel is in an initial deterioration mode, the deterioration determination unit 602 forwards a gray level in accordance with a frame and information on the deterioration status necessary to adjust the gray level to the initial deterioration mode gray level signal generator 603 and instructs the initial deterioration mode gray level signal generator 603 to generate a gray level signal. If a subpixel is in a steady deterioration mode, the deterioration determination unit 602 forwards a gray level in accordance with a frame and information on the deterioration status necessary to adjust the gray level to the steady deterioration mode gray level signal generator 605 and instructs the steady deterioration mode gray level signal generator 605 to generate a gray level signal.

The initial deterioration mode gray level signal generator 603 generates gray level signals for the subpixels in the initial deterioration mode. The initial deterioration mode gray level signal generator 603 generates a gray level signal specifying a deterioration-compensated gray level by consulting the initial deterioration mode lookup table 604, based on the gray level, the information on the deterioration status, and the evaluation results on the second deterioration evaluation regions 212 received from the deterioration determination unit 602.

The steady deterioration mode gray level signal generator 605 generates gray level signals for the subpixels in the steady deterioration mode. The steady deterioration mode gray level signal generator 605 generates a gray level signal specifying a deterioration-compensated gray level by consulting the steady deterioration mode lookup table 606, based on the gray level, the information on the deterioration status, and the evaluation results on the second deterioration evaluation regions 212 received from the deterioration determination unit 602.

Figure 12:
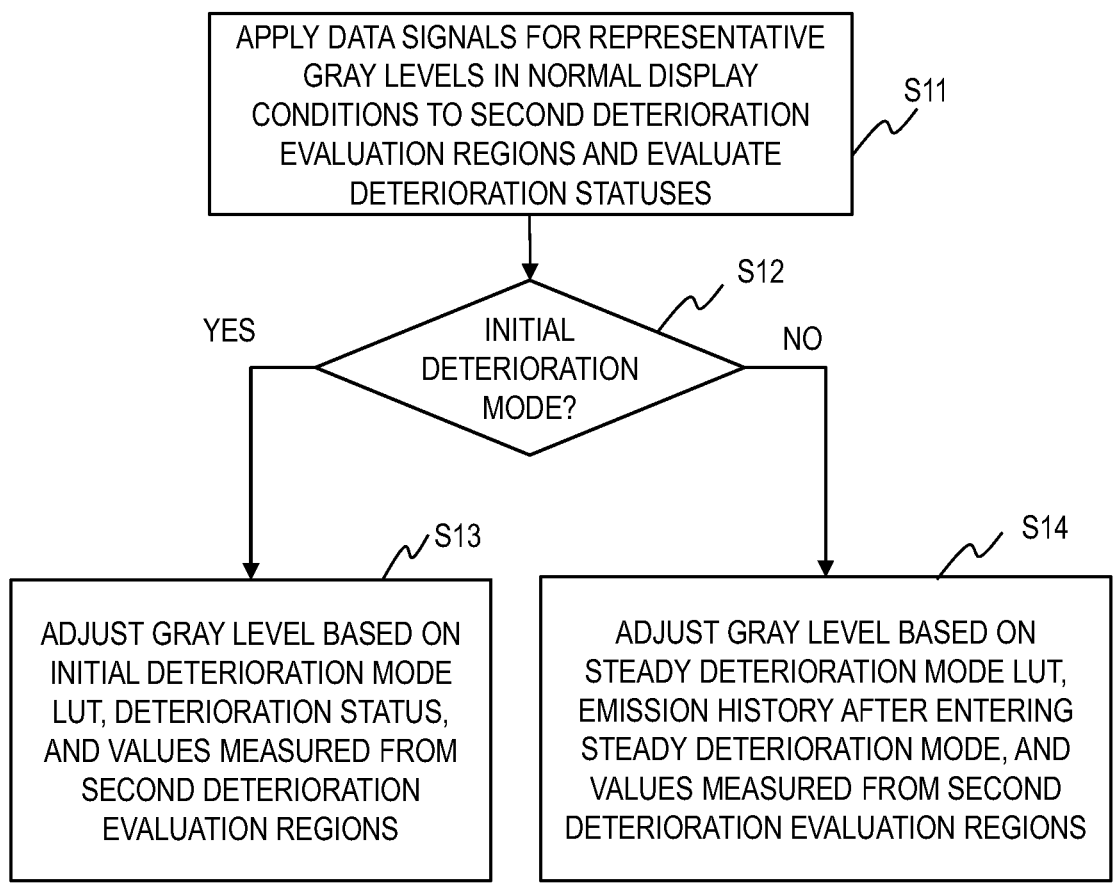
FIG. 12 is a flowchart of an example of normal displaying operation after shipment.

FIG. 12 is a flowchart of an example of normal displaying operation after shipment. The driver IC 134 applies data signals for the representative gray levels in normal display conditions to the second deterioration evaluation regions 212 and evaluates the deterioration statuses (S11). The data signal generator 621 supplies the second deterioration evaluation regions 212 with some or all levels of data signals selected from the lowest to the highest levels of data signals to be supplied to the normal display region 200. Data signals for the gray levels selected in the aging test on the first deterioration evaluation regions 211 can be supplied to the second deterioration evaluation regions 212.

For example, the data signal generator 621 divides the subpixels in the second deterioration evaluation regions 212 into a plurality of groups and supplies data signals for the same gray level to the subpixels in the same group. The gray level of the subpixels in the same group is fixed. At least some different groups are supplied with different levels of data signals.

In an example, each second deterioration evaluation region 212 includes a group to be supplied with data signals for a gray level common between the two regions 212. The data signal generator 621 supplies each subpixel in the second deterioration evaluation regions 212 with data signals for a fixed gray level during the same period as the driving period (operating period) of the normal display region 200. A statistic value, such as an average, of the values measured from the subpixels of the same color at the same gray level can be employed as the determinate value of the subpixels of the color at the gray level.

The data signal generator 621 can also supply data signals to the first deterioration evaluation regions 211. For example, the data signal generator 621 supplies data signals for the same gray levels as the data signals supplied in the aging test on the first deterioration evaluation regions 211 to the subpixels. The data signal generator 621 or the signal processing unit 601 can adjust the data signals depending on the characteristics of the OLED display device 10, independently from the initial deterioration mode gray level signal generator 603 and the steady deterioration mode gray level signal generator 605.

The deterioration detector 633 sends the results of measurement of the current-voltage characteristic of individual subpixels in the second deterioration evaluation regions 212 to the deterioration determination unit 602. Assume that the deterioration detector 633 in this example measures the driving voltages of the OLED elements driven with constant current. As illustrated in FIGS. 3A and 3B, application of data signals to the second deterioration evaluation regions 212 is controlled with the scanning lines 108 and the emission control lines 107 common to the normal display region 200. The deterioration detector 633 detects the driving voltage of the subpixel selected by a selection line 104. The measured value is sent to the deterioration determination unit 602 at each frame, for example.

The deterioration determination unit 602 records the driving history of the normal display region 200 and further, measurement results from the second deterioration evaluation regions 212. In the case where the first deterioration evaluation regions 211 is also to be evaluated, the deterioration determination unit 602 also records measurement results from the first deterioration evaluation regions 211.

Next, the deterioration determination unit 602 determines the deterioration mode of each subpixel in the normal display region 200 (S12). This determination can be performed at every frame or a predetermined number of frames, for example. In an embodiment of this specification, the deterioration determination unit 602 determines the deterioration mode of a subpixel based on the driving history of the subpixel and the measurement results from the second deterioration evaluation regions 212.

For example, the deterioration determination unit 602 determines the standard gray level of a subpixel from the driving history of the subpixel. As described above, the standard gray level is calculated from the total lighting time at each gray level in the driving history; for example, the standard gray level can be the time average of gray levels. The standard gray level is information on the deterioration status of the subpixel. The deterioration determination unit 602 determines the driving voltage of the subpixels of the same color at the standard gray level from the measurement results from the second deterioration evaluation regions 212. If there is no subpixel actually lighting at the standard gray level, the driving voltage can be estimated from the values measured from subpixels lighting at other gray levels using a complementary function.

The deterioration determination unit 602 holds determination reference information indicating the relation between the relative driving voltage and the deterioration mode acquired from the aging test on the first deterioration evaluation regions 211 for each color at each gray level. For example, information indicating the variation in relative driving voltage and the transition point between deterioration modes as illustrated in FIGS. 5A to 5C is held. In the case where the relative driving voltage uniformly increases with driving time, respective relative driving voltages of the standard gray levels can be held as information indicating transition points.

The deterioration determination unit 602 determines whether a subpixel of interest has entered a steady deterioration mode from the history of relative driving voltage of the subpixels of the same color at the standard gray level in the second deterioration evaluation regions 212 and the relation between the relative driving voltage of a subpixel of the color at the standard gray level and the deterioration mode according to the determination reference information. The reference value of the relative driving voltage in the second deterioration evaluation regions 212 can be determined at shipment or can be the value measured first after shipment.

If the subpixel of interest remains in the initial deterioration mode (S12: YES), the initial deterioration mode gray level signal generator 603 adjusts the gray level in accordance with the instruction from the deterioration determination unit 602 (S13). The initial deterioration mode gray level signal generator 603 acquires information on the color and the gray level based on the video frame and information for adjusting the gray level from the deterioration determination unit 602. For example, the information for adjustment indicates the relative driving voltage of the subpixels of the color at the standard gray level in the second deterioration evaluation regions 212.

The initial deterioration mode gray level signal generator 603 determines the adjustment amount for the gray level acquired from the video frame by consulting the initial deterioration mode lookup table 604 with the color, the standard gray level, and the current gray level of the subpixel. The initial deterioration mode lookup table 604 can provide an adjustment amount in response to input of a color, a standard gray level, a relative driving voltage, and a current gray level.

The initial deterioration mode gray level signal generator 603 can determine the adjustment amount in the initial deterioration mode (initial deterioration period) without using the measurement results from the second deterioration evaluation regions 212 as described above. Alternatively, the initial deterioration mode gray level signal generator 603 can maintain zero adjustment in the initial deterioration mode.

If the subpixel has entered a steady deterioration mode (S12: NO), the steady deterioration mode gray level signal generator 605 adjusts the gray level in accordance with the instruction from the deterioration determination unit 602 (S14). The steady deterioration mode gray level signal generator 605 acquires information on the color and the gray level based on the video frame and information for adjusting the gray level from the deterioration determination unit 602. For example, the information for adjustment includes the standard gray level and the driving time after the subpixel enters the steady deterioration mode. The driving time and the standard gray level after entering the steady deterioration mode are information on the deterioration status. Defining the status at the start of the steady deterioration mode as initial status and adjusting the gray level using the initial status as a reference enable adjustment more appropriate for the steady deterioration mode. A status later than the start of the steady deterioration mode can be defined as initial status and the information on the standard gray level can be excluded.

The steady deterioration mode gray level signal generator 605 adjusts the current gray level by consulting the steady deterioration mode lookup table 606 with the driving time and the standard gray level after entering the steady deterioration mode. The steady deterioration mode lookup table 606 can provide an adjustment amount in response to input of a color, a standard gray level, a driving time after entering the steady deterioration mode, and a current gray level.

The adjustment information updater 607 updates the steady deterioration mode lookup table 606 based on the measurement results from the second deterioration evaluation regions 212. The frequency of update can be every predetermined operating period of the normal display region 200. The adjustment information updater 607 acquires the measurement history of the second deterioration evaluation regions 212 from the deterioration determination unit 602. The measurement history of the second deterioration evaluation regions 212 can be the variation of relative driving voltages for a plurality of gray levels with respect to the driving time after entering a steady deterioration mode. The plurality of gray levels can be the gray levels actually used in driving the second deterioration evaluation regions 212.

Figure 13:
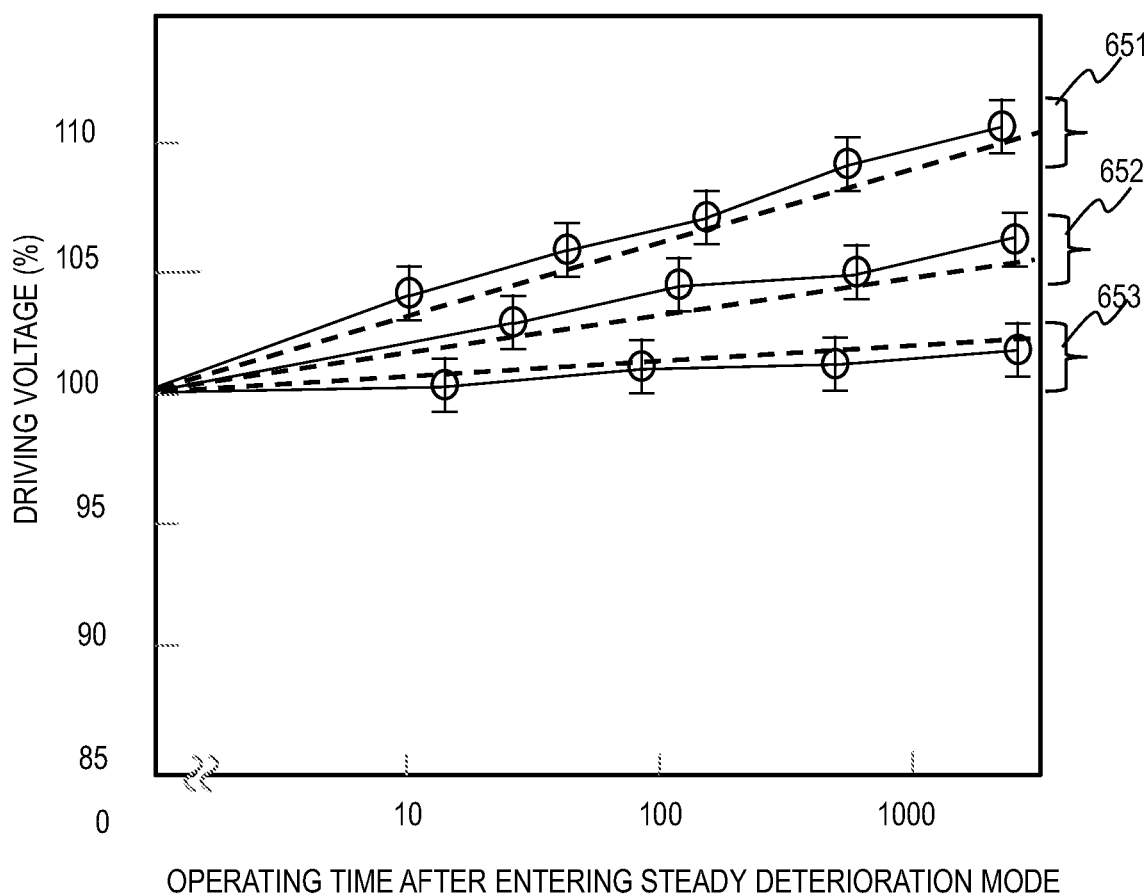
FIG. 13 provides examples of driving voltage under constant current driving measured from the second deterioration evaluation region.

FIG. 13 provides examples of driving voltage under constant current driving measured from the second deterioration evaluation region 212. FIG. 13 provides data at the gray levels of 15 (653), 63 (652), and 256 (651). In FIG. 13, dashed lines represent estimated values based on the results of the aging test. Each mark Φ represents a value measured from the second deterioration evaluation regions 212. Each solid line represents the result obtained by adjusting estimated values with measured values. The reference value of the relative driving voltage is the value at the start of the steady deterioration mode.

The adjustment information updater 607 corrects the temporal variation of relative driving voltage in the steady deterioration mode estimated based on the aging test on the first deterioration evaluation regions 211 with the measurement results from the second deterioration evaluation regions 212 and further, updates the steady deterioration mode lookup table 606 in accordance with the correction. As a result, the gray levels for the subpixels in the steady deterioration mode are determined based on the measurement results from the second deterioration evaluation regions 212. The gray levels are adjusted based on the statuses of the subpixels that have progressed in deterioration; more accurate deterioration compensation becomes available.

The above-described example updates the steady deterioration mode lookup table 606 based on the measurement results from the second deterioration evaluation regions 212. Another example can use the post-shipment measurement results from the first deterioration evaluation regions 211 together. They provide information on more deteriorated subpixels.

Another example can adjust a gray level by the same adjustment method as the one in the initial deterioration mode, defining the driving voltage at the start of the steady deterioration mode as reference value. Still another example can adjust a gray level for a subpixel in the initial deterioration mode without reference to the measurement results from the second deterioration evaluation regions 212 and adjust a gray level for a subpixel in the steady deterioration mode with reference to the measurement results from the second deterioration evaluation regions 212.

Light Blocking Structure

Hereinafter, a structure for blocking light from the second deterioration evaluation regions 212 is described. As described above, the OLED display device 10 lights the second deterioration evaluation regions 212 together with the normal display region 200 after shipment. Since the normal display region 200 displays images in accordance with video data, the OLED display device 10 includes a light blocking structure for blocking light from the second deterioration evaluation regions 212 to prevent the displayed images from being affected. In the case where the first deterioration evaluation regions 211 is lit together with the normal display region 200, the light blocking structure also blocks the light from the first deterioration evaluation regions 211 together with the light from the second deterioration evaluation regions 212.

Figure 14:
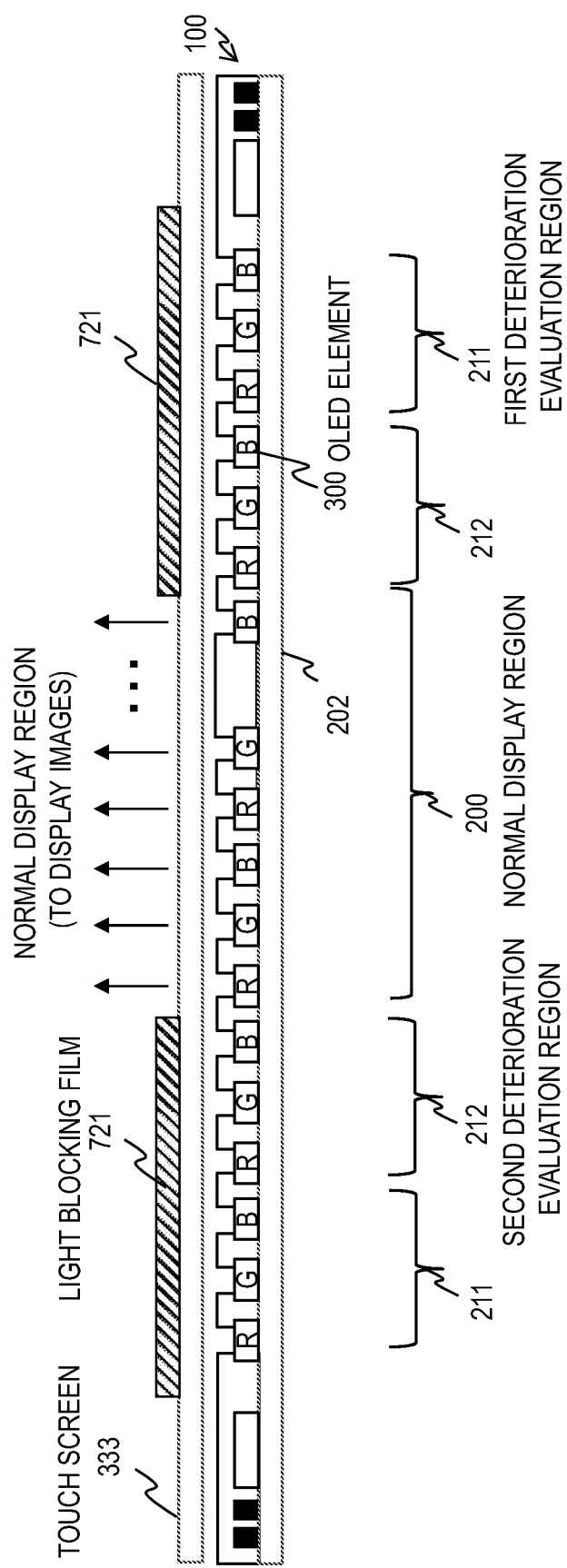
FIG. 14 illustrates an example of a light blocking structure.

FIG. 14 illustrates an example of the light blocking structure. The example of the structure in FIG. 14 includes light blocking films 721 in a metal layer on the substrate of a touch screen 333. The metal layer includes electrodes or lines for detecting a touch on the touch screen 333, in addition to the light blocking films 721. This efficient structure enables the light from the second deterioration evaluation regions 212 not to be seen by the user in front of the panel.

FIG. 14 schematically illustrates an insulating substrate 202 of a TFT substrate 100 and OLED elements 300 on the insulating substrate 202. The touch screen 333 is disposed in front of the TFT substrate 100 (on the side of the TFT substrate 100 closer to the user who sees images) and can be included in the structural encapsulation unit 250 illustrated in FIG. 1.

The light blocking films 721 are metal films that do not transmit light. In the configuration example of FIG. 14, the light blocking films 721 is covering not only the second deterioration evaluation regions 212 but also the first deterioration evaluation regions 211 when viewed from the front. In the case where the first deterioration evaluation regions 211 do not light after shipment, the light blocking films 721 can be excluded in the regions in front of the first deterioration evaluation regions 211.

Figure 15:
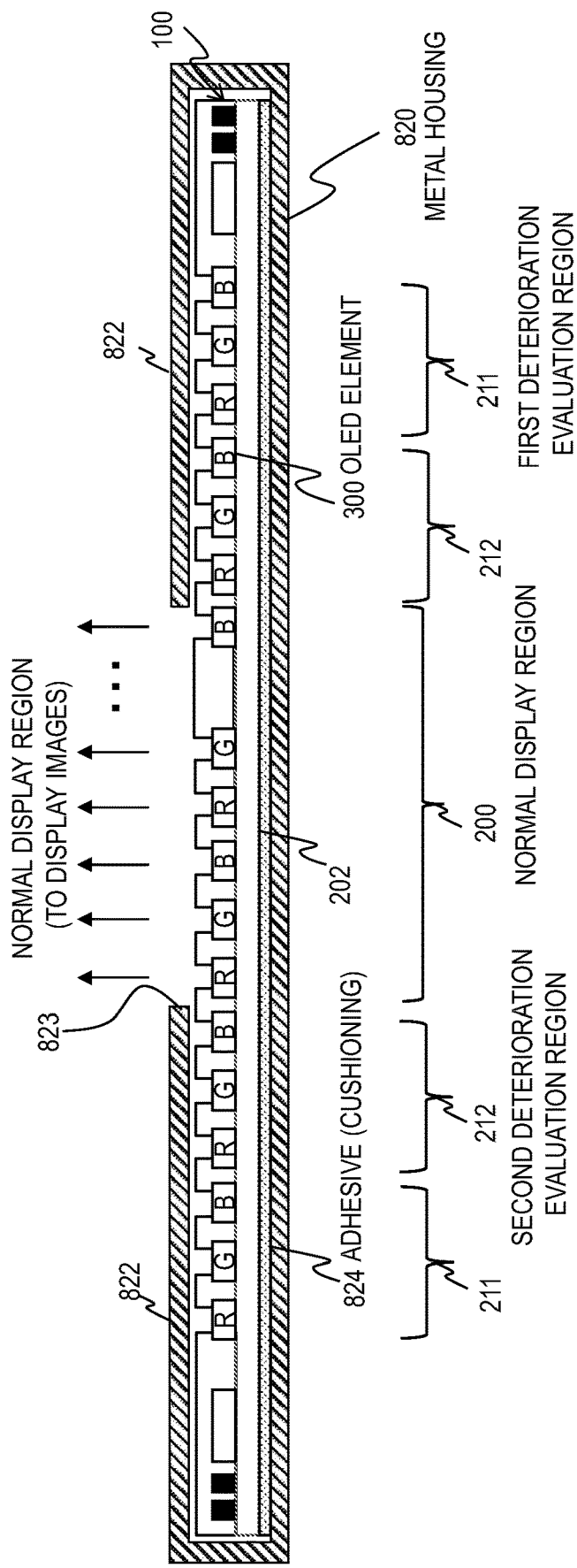
FIG. 15 illustrates another example of a light blocking structure.

FIG. 15 illustrates another example of the light blocking structure. The example of the structure in FIG. 15 blocks light from the second deterioration evaluation regions 212 with a metal housing 820. This efficient structure enables the light from the second deterioration evaluation regions 212 not to be seen by the user in front of the panel.

The metal housing 820 accommodates the TFT substrate 100 and includes a frame-like bezel region 822 surrounding the outer end of the front face of the TFT substrate 100 on which images are displayed. The back surface of the insulating substrate 202 is adhered to the inside bottom surface of the metal enclosure 820 by an adhesive (cushioning material) 824. The metal housing 820 has an opening 823 inner than the bezel region 822 on the front. The normal display region 200 is viewed through the opening 823. The second deterioration evaluation regions 212 are covered with the bezel region 822.

The bezel region 822 in the configuration example of FIG. 15 is covering not only the second deterioration evaluation regions 212 but also the first deterioration evaluation regions 211 when viewed from the front. In the case where the first deterioration evaluation regions 211 do not light after shipment, the first deterioration evaluation regions 211 can be exposed from the meal housing 820.

The second deterioration evaluation regions 212 and the first deterioration evaluation regions 211 can be covered with another light blocking structure, such as light blocking films in a black resin layer of the TFT substrate 100 or a not-shown color filter substrate. The housing can be made of another material having a light blocking property, for example, resin. As described above, the light blocking films 721 and the part of the metal housing 820 are light blocking regions.

Figure 16:
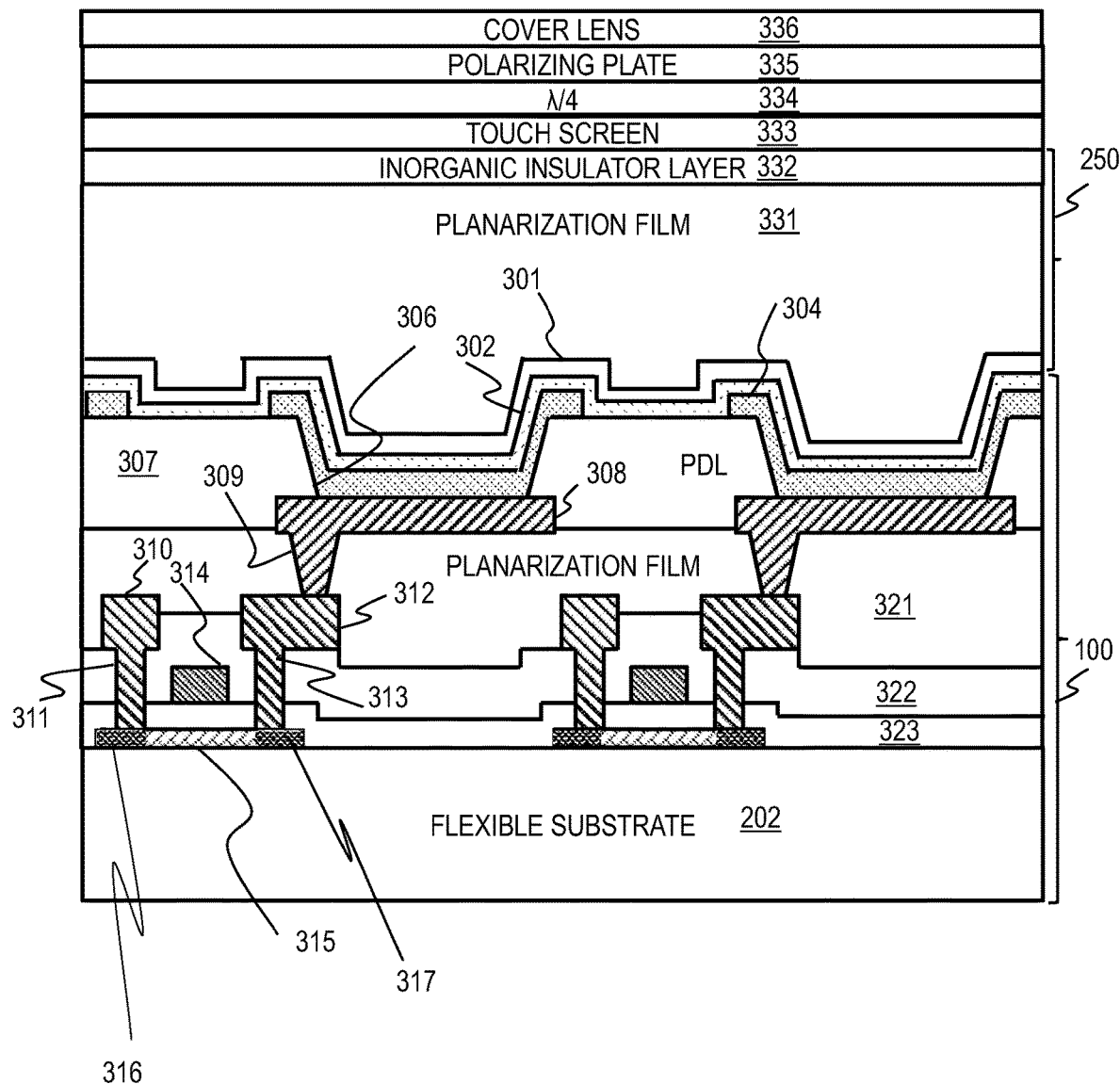
FIG. 16 schematically illustrates a cross-sectional structure of a substrate, driving TFTs, and OLED elements of a TFT substrate and an encapsulation structural unit.

FIG. 16 schematically illustrates a cross-sectional structure of the substrate, driving TFTs, and OLED elements of the TFT substrate 100 and the encapsulation structural unit 250. The insulating substrate is a flexible substrate but can be a rigid substrate. In the following description, the definitions of top and bottom correspond to the top and the bottom of the drawing. The structural encapsulation unit 250 can be an encapsulation substrate.

An OLED display device includes a TFT substrate 100 and a structural encapsulation unit 250. The TFT substrate 100 includes a substrate 202, and pixel circuits (a TFT array) and OLED elements fabricated on the substrate 202. The pixel circuits and the OLED elements are provided between the substrate 202 and the structural encapsulation unit 250.

The substrate 202 is a flexible substrate composed of a plurality of layers including an organic layer (for example, a polyimide layer) and an inorganic layer (for example, a silicon oxide layer or a silicon nitride layer). The pixel circuits (TFT array) and the OLED elements are fabricated on the substrate 202. An OLED element includes a lower electrode (for example, an anode electrode 308), an upper electrode (for example, a cathode electrode 302), and a multilayer organic light-emitting film 304. The multilayer organic light-emitting film 304 is located between the cathode electrode 302 and the anode electrode 308. A plurality of anode electrodes 308 are disposed on the same plane (for example, on a planarization film 321); one multilayer organic light-emitting film 304 is disposed above one anode electrode 308. In the example of FIG. 16, the cathode electrode 302 of one subpixel is a part of an unseparated conductor film.

Illustrated in FIG. 16 is an example of a top-emission pixel structure, which includes top-emission type of OLED elements. The top-emission pixel structure is configured in such a manner that a cathode electrode 302 common to a plurality of pixels is provided on the light emission side (the side to be viewed or the upper side of the drawing). The cathode electrode 302 has a shape that fully covers the entire pixel array region 125. The top-emission pixel structure is characterized by that the anode electrodes 308 have light reflectivity and the cathode electrode 302 has light transmissivity. Hence, a configuration to transmit light coming from the multilayer organic light-emitting films 304 toward the structural encapsulation unit 250 is attained.

Compared to a bottom-emission pixel structure configured to extract light toward the substrate 202, the top-emission type does not need a light transmissive region within a pixel region to extract light. For this reason, the top-emission type has high flexibility in laying out pixel circuits. For example, the light-emitting regions can be provided above the pixel circuits or lines.

The bottom-emission pixel structure has a transparent anode electrode and a reflective cathode electrode to emit light to the external through the substrate (from the side to be viewed). If both the anode electrode and the cathode electrode are made of light transmissive materials, a transparent display device can be obtained. The structure of the flexible substrate of this disclosure is applicable to OLED display devices of any of these types and further, display devices including light-emitting elements other than OLEDs.

A subpixel of a full-color OLED display device usually lights in one of the colors of red, green, and blue. A red subpixel, a green subpixel, and a blue subpixel constitute one main pixel. A pixel circuit including a plurality of thin-film transistors controls light emission of an OLED element associated therewith. An OLED element is composed of an anode electrode as a lower electrode, an organic light-emitting film, and a cathode electrode as an upper electrode.

An OLED display device includes a plurality of pixel circuits (a TFT array). Each of the pixel circuits includes a plurality of switches; it is formed between the substrate 202 and an anode electrode 308 to control the electric current to be supplied to the anode electrode 308. The driving TFTs in FIG. 16 have a top-gate structure. The other TFTs also have the top-gate structure.

A polysilicon layer is provided above the substrate 202. The polysilicon layer includes channels 315 at the locations where gate electrodes 314 are to be formed later. The characteristics of a TFT is determined by the channel 315. At both ends of each channel 315, source/drain regions 316 and 317 are provided. The source/drain regions 316 and 317 are doped with high-concentration impurities for electrical connection with a wiring layer thereabove.

Lightly doped drains (LDDs) doped with low-concentration impurities can be provided between the channel 315 and the source/drain region 316 and between the channel 315 and the source/drain region 317. FIG. 16 omits the LDDs to avoid complexity. Above the polysilicon layer, gate electrodes 314 are provided with a gate insulating film 323 interposed therebetween. An interlayer insulating film 322 is provided above the layer of the gate electrodes 314.

Within the pixel array region 125, source/drain electrodes 310 and 312 are provided above the interlayer insulating film 322. Each source/drain electrode 310 and each source/drain electrode 312 are connected with a source/drain region 316 and a source/drain region 317 of the polysilicon layer through contact holes 311 and 313 provided in the interlayer insulating film 322 and the gate insulating film 323.

Over the source/drain electrodes 310 and 312, an insulating organic planarization film 321 is provided. Above the planarization film 321, anode electrodes 308 are provided. Each anode electrode 308 is connected with a source/drain electrode 312 through a contact hole 309 in the planarization film 321. The TFTs of a pixel circuit are formed below the anode electrode 308.

An anode electrode 308 can be composed of a reflective metal layer in the middle and transparent conductive layers sandwiching the reflective metal layer. Above the anode electrodes 308, an insulating pixel defining layer (PDL) 307 is provided to separate OLED elements. OLED elements are formed in openings 306 of the pixel defining layer 307.

Above each anode electrode 308, a multilayer organic light-emitting film 304 is provided. The multilayer organic light-emitting film 304 is in contact with the pixel defining layer 307 in the opening 306 of the pixel defining layer 307 and its periphery. Each multilayer organic light-emitting film 304 is formed by depositing organic light-emitting material for the color of R, G, or B on an anode electrode 308.

A multilayer organic light-emitting film 304 is formed by vapor deposition of organic light-emitting material in the region corresponding to a pixel through a metal mask. A multilayer organic light-emitting film 304 consists of, for example, a hole injection layer, a hole transport layer, a light-emitting layer, an electron transport layer, and an electron injection layer in this order from the bottom. The layered structure of the multilayer organic light-emitting film 304 is determined depending on the design.

A cathode electrode 302 is provided over the multilayer organic light-emitting film 304. The cathode electrode 302 is a light-transmissive electrode. The cathode electrode 302 transmits part of the visible light coming from the multilayer organic light-emitting film 304. The layer of the cathode electrode 302 is formed by vapor deposition of a metal such as Al or Mg or an alloy thereof. If the resistance of the cathode electrode 302 is so high to impair the uniformity of the brightness of emitted light, an additional auxiliary electrode layer may be formed using a material for a transparent electrode, such as ITO or IZO.

The stack of the anode electrode 308, the multilayer organic light-emitting film 304, and the cathode electrode 302 formed in an opening 306 of the pixel defining layer 307 corresponds to an OLED element. A structural encapsulation unit 250 is provided above and in direct contact with the cathode electrode 302. The structural encapsulation unit (thin-film encapsulation unit) 250 includes an inorganic insulator layer 301, an organic planarization film 331, and another inorganic insulator layer 332 in this order from the bottom. The inorganic insulator layers 301 and 332 are a lower passivation layer and an upper passivation layer for enhancing the reliability.

A touch screen 333, a λ/4 plate 334, a polarizing plate 335, and a resin cover lens 336 are laid in this order toward the top, on the encapsulation structural unit 250. The λ/4 plate 334 and the polarizing plate 335 are to reduce the reflection of the light coming from the external. The layered structure of the OLED display device described with reference to FIG. 16 is an example; one or more of the layers in FIG. 16 may be omitted and one or more layers not shown in FIG. 16 may be added. Instead of depositing a touch screen on the TFT substrate 100, a touch screen manufactured in a process independent from the process for the TFT substrate 100 can be bonded to the TFT substrate 100 with proper alignment.

Figure 17:
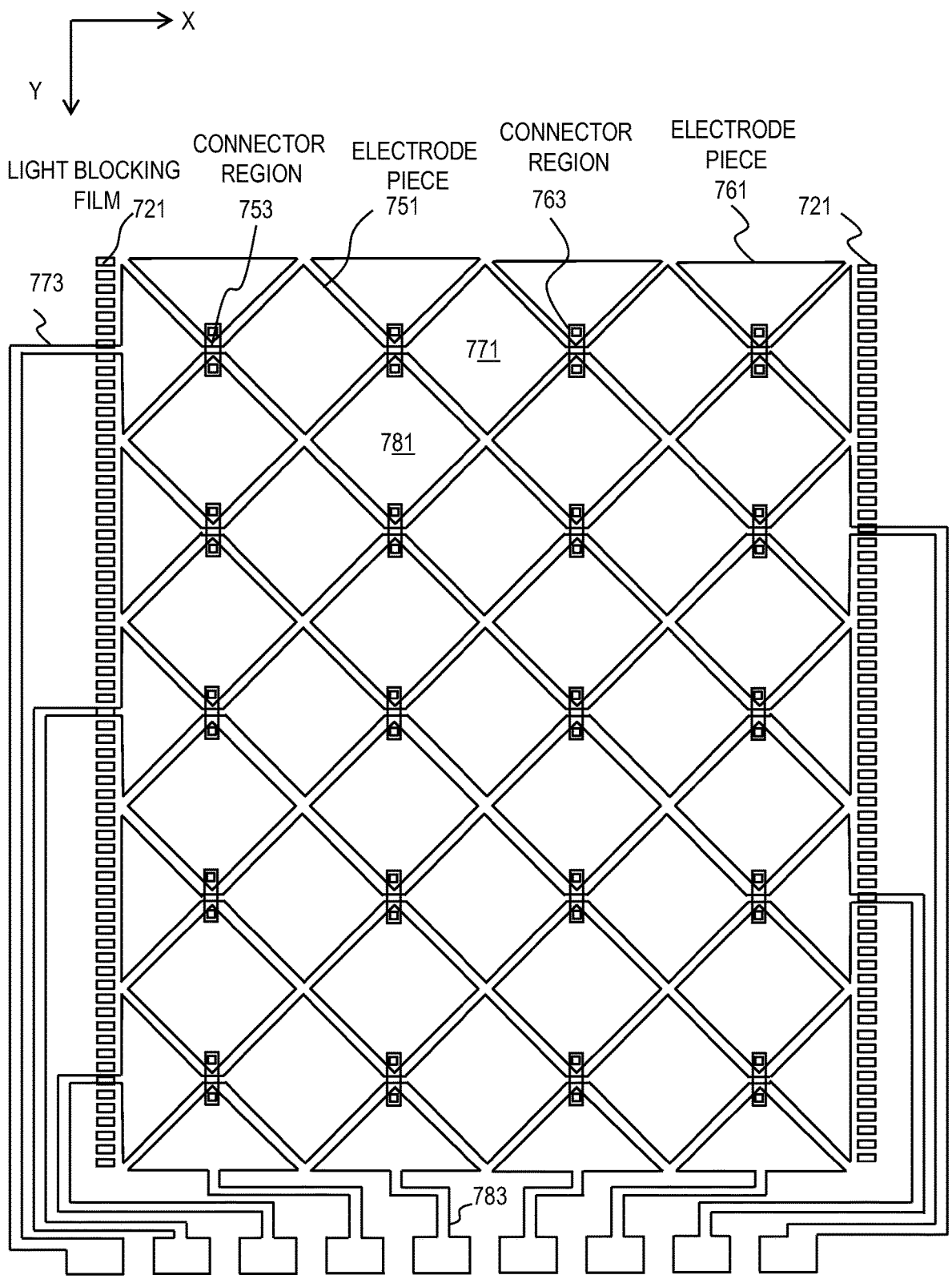
FIG. 17 is a plan diagram illustrating an example of a light blocking film pattern and a touch electrode pattern formed on a touch screen.

FIG. 17 is a plan diagram illustrating an example of a light blocking film pattern and a touch electrode pattern formed on a touch screen 333. The electrode pattern illustrated in FIG. 17 is for a projected capacitive touch screen. The touch screen 333 includes X touch electrodes 771 extending along the X-axis and disposed one above another along the Y-axis and Y touch electrodes 781 extending along the Y-axis and disposed side by side along the X-axis. In FIG. 17, one of the X touch electrodes and one of the Y touch electrodes are provided with reference signs 771 and 781, respectively, by way of example.

Each X touch electrode 771 is composed of rhombic or triangular electrode pieces 751 disposed along the X-axis and rectangular connector regions 753 for connecting corners of electrode pieces 751 adjacent to each other. The connector regions 753 are narrower than the electrode pieces 751. The electrode pieces 751 and the connector regions 753 are made of a transparent conductor such as ITO. An X touch electrode 771 is made of an unseparated transparent conductor; its electrode pieces 751 and connector regions 753 are included in the same layer.

Each Y touch electrode 781 is composed of rhombic or triangular electrode pieces 761 disposed along the Y-axis and rectangular connector regions 763 for connecting corners of electrode pieces 761 adjacent to each other. The connector regions 763 are narrower than the electrode pieces 761. The electrode pieces 761 are made of a transparent conductor such as ITO or IZO. In the example of FIG. 17, the electrode pieces 761 are included in the same layer as the X touch electrodes 771. The connector regions 763 are provided on a layer upper than the electrode pieces 761 and made of a conductor (metal) having a light blocking property. The connector regions 763 can be made of Al or Mo.

The electrode pieces 751 of the X touch electrodes 771 and the electrode pieces 761 of the Y touch electrodes 781 are disposed in a matrix. The driver IC 134 or a not-shown detector circuit detects a capacitive change between an X touch electrode 771 and a Y touch electrode 781 caused by a pointer such as a finger or a touch pen approaching the touch screen 333 through lines 773 and 783. The touch point is located through this operation.

The connector regions 763 of the Y touch electrodes 781 are disposed to intersect with the connector regions 753 of the X touch electrodes 771 when viewed planarly. An insulating layer (not shown) is provided between the layer of the connector regions 763 and the layer of the X touch electrodes 771. An insulating film is interposed between a connector region 763 and a connector region 753 at their intersection to maintain their electrical isolation.

The touch screen 333 further includes a light blocking film pattern composed of a plurality of light blocking films 721. The light blocking films 721 are disposed outside the touch detection region where the touch electrodes 771 and 781 are disposed. As described above, the light blocking films 721 are made of light blocking material; in the example of FIG. 17, they are on the same layer as the connector regions 763 of the Y touch electrodes 781, that is to say, they are made of a metal having a light blocking property. Forming the light blocking films 721 on the same layer as the light blocking elements of the touch screen 333 improves the efficiency in manufacturing the display device. Providing a plurality of light blocking films 721 makes the size of one light blocking film smaller, achieving less unfavorable effect on touch detection.

The configuration example in FIG. 17 includes columns of light blocking films on both sides of the touch detection region. The number of columns and the number of light blocking films per column can be selected desirably. As described with reference to FIG. 14, the light blocking films 721 are aligned to cover the dummy subpixels so that the light from the dummy subpixels does not leak toward the user. The pattern of the light blocking films 721 is also determined desirably; for example, the patterns (the number and the shape) of light blocking films 721 on both sides of the touch detection region can be different. The number and the shape of the light blocking films for the first deterioration evaluation regions can be different from the number and the shape of the light blocking films for the second deterioration evaluation region.

The light blocking films 721 can be provided on another layer including a light blocking element of the touch screen 333 different from the touch electrodes or a layer other than the touch screen 333. Any sensing method can be selected for the touch screen 333 and moreover, the touch screen 333 does not have to be included.

Post-Shipment Control for First Deterioration Evaluation Regions

Post-shipment control for the first deterioration evaluation regions 211 by the OLED display device 10 is described. The configuration example of the OLED display device 10 in this section maintains the first deterioration evaluation regions 211 in a non-lighting state when the OLED display device 10 is operating. After shipment, deterioration evaluation on the first deterioration evaluation regions 211 is not performed.

Figure 18:
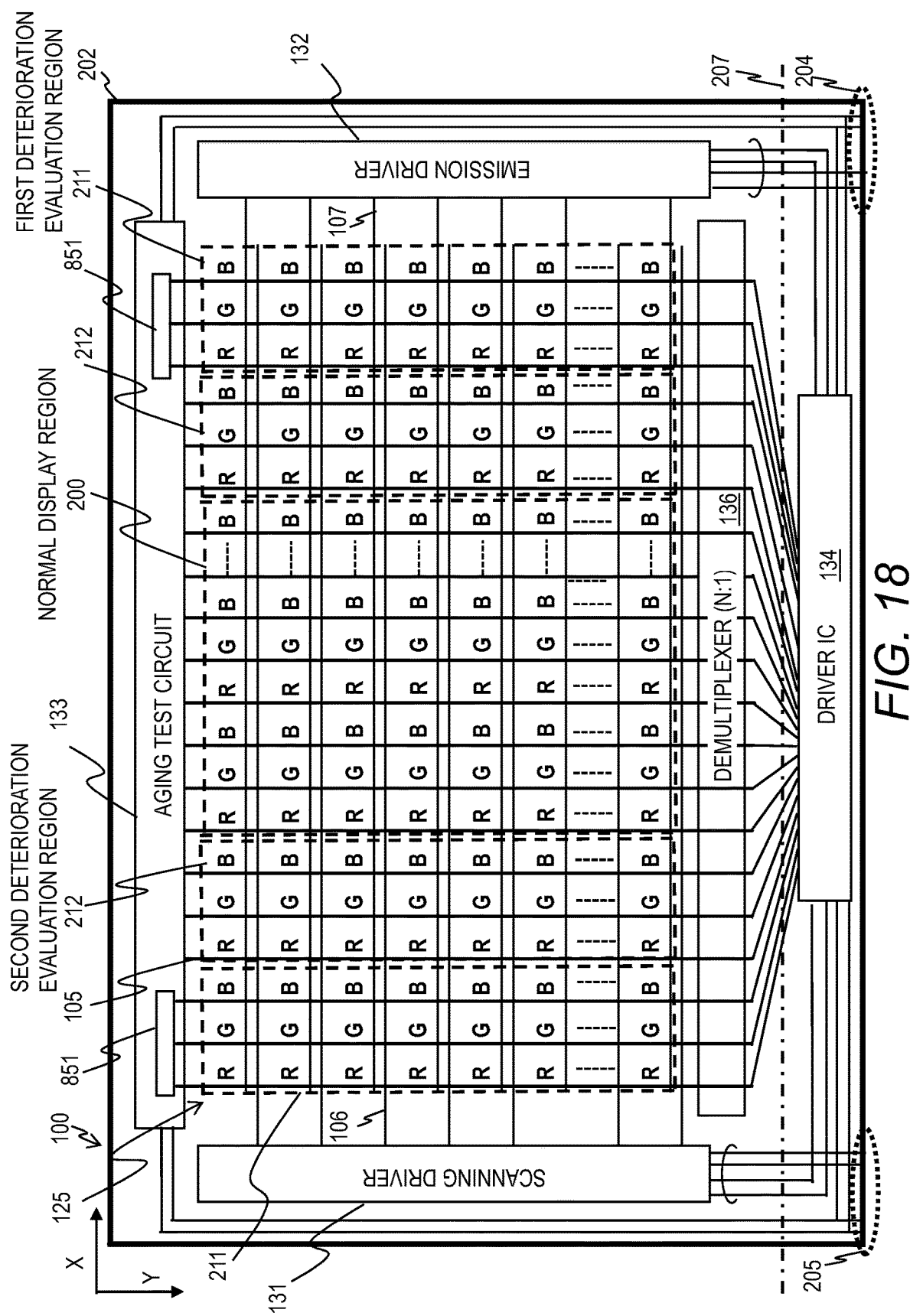
FIG. 18 illustrates a configuration example of an OLED display device that maintains the first deterioration evaluation regions in a non-lighting state.

FIG. 18 illustrates a configuration example of the OLED display device 10 that maintains the first deterioration evaluation regions 211 in a non-lighting state. The aging test circuit 133 includes data selection circuits 851. Each data selection circuit 851 supplies data signals specifying a value equal to or lower than the absolute value of the data signal for the gray level 0 in the normal display region 200 to all data lines for the first deterioration evaluation regions 211. As a result, all dummy pixels in the first deterioration evaluation regions 211 are maintained in a non-lighting state. Hence, the light blocking structure for the first deterioration evaluation regions 211 becomes unnecessary.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a display region on a substrate, the display region including a plurality of display pixels and being configured to display images in accordance with video data from an external source;
   a deterioration evaluation region disposed outside the display region on the substrate, the deterioration evaluation region including a plurality of dummy pixels;
   a light blocking part disposed on a side to be viewed of the deterioration evaluation region; and
   a control circuit configured to control the display region and the deterioration evaluation region,
   wherein each of the plurality of display pixels and the plurality of dummy pixels includes a light-emitting element and a pixel circuit, and
   wherein the control circuit is configured to:
      determine a gray level for a first display pixel based on video data;
      determine whether the first display pixel is in a first deterioration mode or a second deterioration mode following the first deterioration mode based on a driving history of the first display pixel;
      determine, in a case of determining that the first display pixel is in the first deterioration mode, a data signal to be supplied to the first display pixel based on the gray level and the driving history of the first display pixel, using first adjustment information for the first deterioration mode; and
      determine, in a case of determining that the first display pixel is in the second deterioration mode, a data signal to be supplied to the first display pixel based on the gray level, the driving history of the first display pixel, and measurement results about a current-voltage characteristic acquired from dummy pixels in the deterioration evaluation region of the same color as the first display pixel, using second adjustment information for the second deterioration mode that is different from the first adjustment information.

2. The display device according to claim 1, further comprising:
   a touch screen on a side to be viewed of the display region,
   wherein the light blocking part is included in a metal layer on the touch screen.

3. The display device according to claim 1, further comprising:
   a housing accommodating the substrate,
   wherein the light blocking part is a part of the housing; housing.

4. The display device according to claim 1, further comprising:
   a test region disposed outside the display region, the test region including a plurality of test pixels,
   wherein the deterioration evaluation region is located between the test region and the display region,
   wherein each of the plurality of test pixels includes a light-emitting element and a pixel circuit, and
   wherein the first adjustment information and the second adjustment information are based on measurement results about a relation between driving history and luminance of emitted light acquired from the plurality of test pixels.

5. The display device according to claim 4,
   wherein the control circuit is configured to:
   hold determination reference information based on the measurement results about the relation between driving history and luminance of emitted light acquired from the plurality of test pixels; and
   determine whether the first display pixel is in a first deterioration mode or a second deterioration mode following the first deterioration mode based on a driving history of the first display pixel, measurement results about a current-voltage characteristic acquired from dummy pixels of the same color as the first display pixel, and the determination reference information.

6. The display device according to claim 4, wherein the control circuit is configured to maintain the light-emitting elements in the test region in a non-lighting state during a period of displaying images in accordance with video data.

* * * * *